United States Patent
Tabrizian

(10) Patent No.: US 11,689,179 B2
(45) Date of Patent: Jun. 27, 2023

(54) LAMB WAVE RESONATORS IN SINGLE-CRYSTAL SUBSTRATE

(71) Applicant: UNIVERSITY OF FLORIDA RESEARCH FOUNDATION, INCORPORATED, Gainesville, FL (US)

(72) Inventor: Roozbeh Tabrizian, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 695 days.

(21) Appl. No.: 16/714,635

(22) Filed: Dec. 13, 2019

(65) Prior Publication Data

US 2020/0202832 A1 Jun. 25, 2020

Related U.S. Application Data

(60) Provisional application No. 62/782,056, filed on Dec. 19, 2018.

(51) Int. Cl.
*H03H 9/02* (2006.01)
*H03H 9/00* (2006.01)

(52) U.S. Cl.
CPC ...... *H03H 9/02228* (2013.01); *H03H 9/0095* (2013.01); *H03H 9/02007* (2013.01)

(58) Field of Classification Search
CPC .................................. H03H 9/02; H03H 9/24
See application file for complete search history.

(56) References Cited

U.S. PATENT DOCUMENTS

| | | | | |
|---|---|---|---|---|
| 8,264,303 B2* | 9/2012 | Suzuki | ............... | H03H 9/02015 |
| | | | | 333/155 |
| 8,367,305 B1* | 2/2013 | Wojciechowski | ... | H03H 9/2405 |
| | | | | 430/319 |
| 8,772,999 B2* | 7/2014 | Mohanty | .............. | H03H 9/2405 |
| | | | | 310/309 |
| 9,172,351 B2* | 10/2015 | Khine | ....................... | H03H 9/54 |
| 9,383,208 B2* | 7/2016 | Mohanty | .................. | H03B 5/30 |
| 9,525,398 B1* | 12/2016 | Olsson | ............... | H03H 9/02228 |
| 10,771,039 B2* | 9/2020 | Kimura | ................... | H03H 9/174 |
| 11,393,973 B2* | 7/2022 | Ghatge | ............. | H03H 9/02031 |
| 11,405,014 B1* | 8/2022 | Branch | ................... | H03H 9/133 |
| 11,489,512 B2* | 11/2022 | Nishimura | ........... | H03H 9/2463 |

* cited by examiner

*Primary Examiner* — Hafizur Rahman
*Assistant Examiner* — Alan Wong
(74) *Attorney, Agent, or Firm* — Alston & Bird LLP

(57) ABSTRACT

An acoustic waveguide having high-Q resonator characteristics is disclosed and a fabrication method is described. Various waveguide-based test-vehicles, implemented in single crystal silicon and transduced by thin aluminum nitride films, are demonstrated. Silicon resonators with type-I and type-II dispersion characteristics are presented to experimentally justify the analytical mode synthesis technique for realization of high quality-factor silicon Lamb wave resonators. An analytical design procedure is also presented for geometrical engineering of the waveguides to realize high-Q resonators without the need for geometrical suspension through narrow tethers or rigid anchors. The effectiveness of the dispersion engineering methodology is verified through development of experimental test-vehicles in 20 μm-thick single-crystal silicon (SCS) waveguides with 500 nm aluminum nitride transducers.

11 Claims, 21 Drawing Sheets

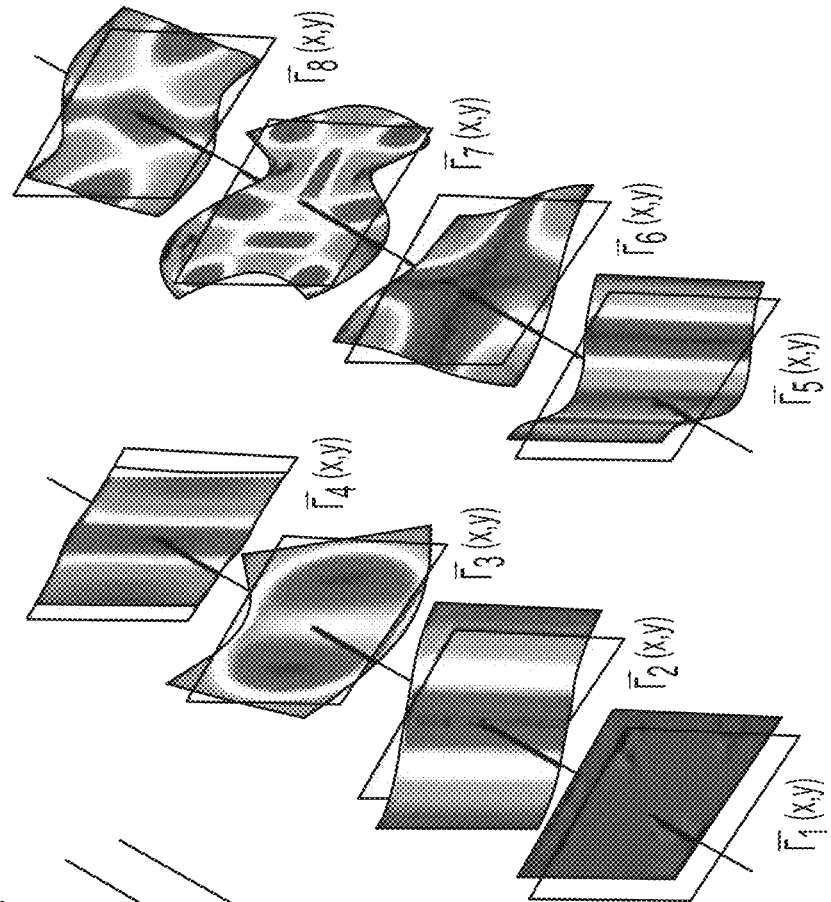
FIG. 1C
FIG. 1B
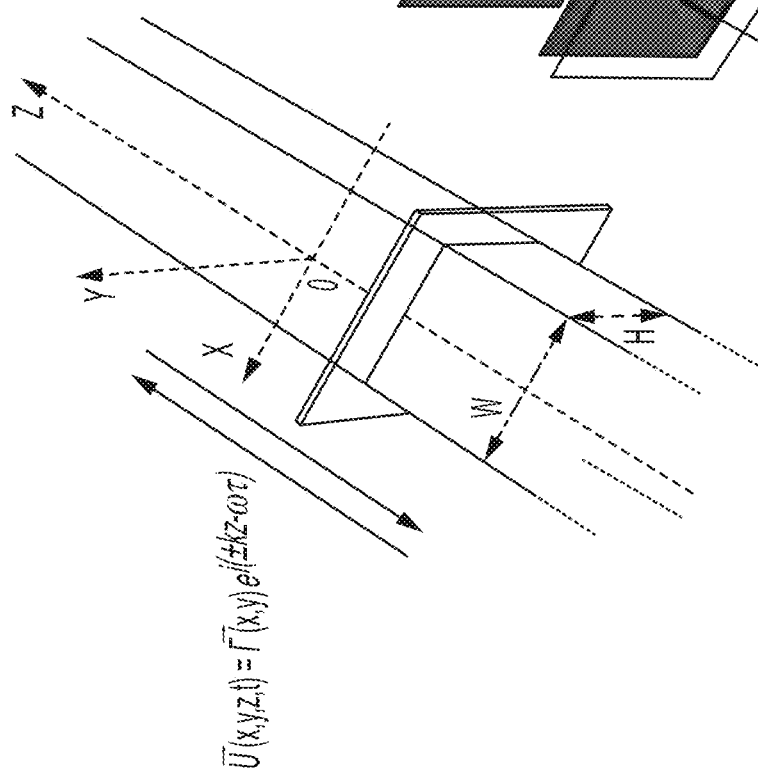
FIG. 1A

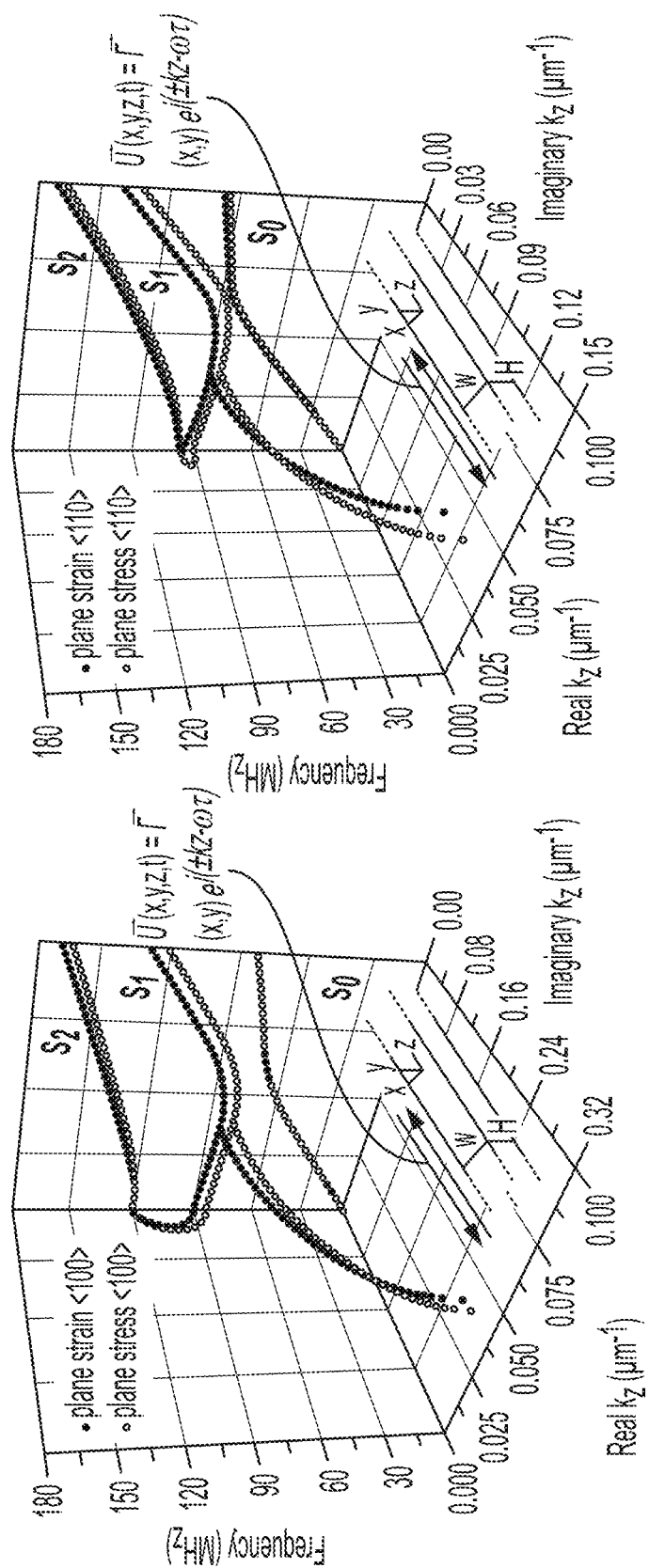

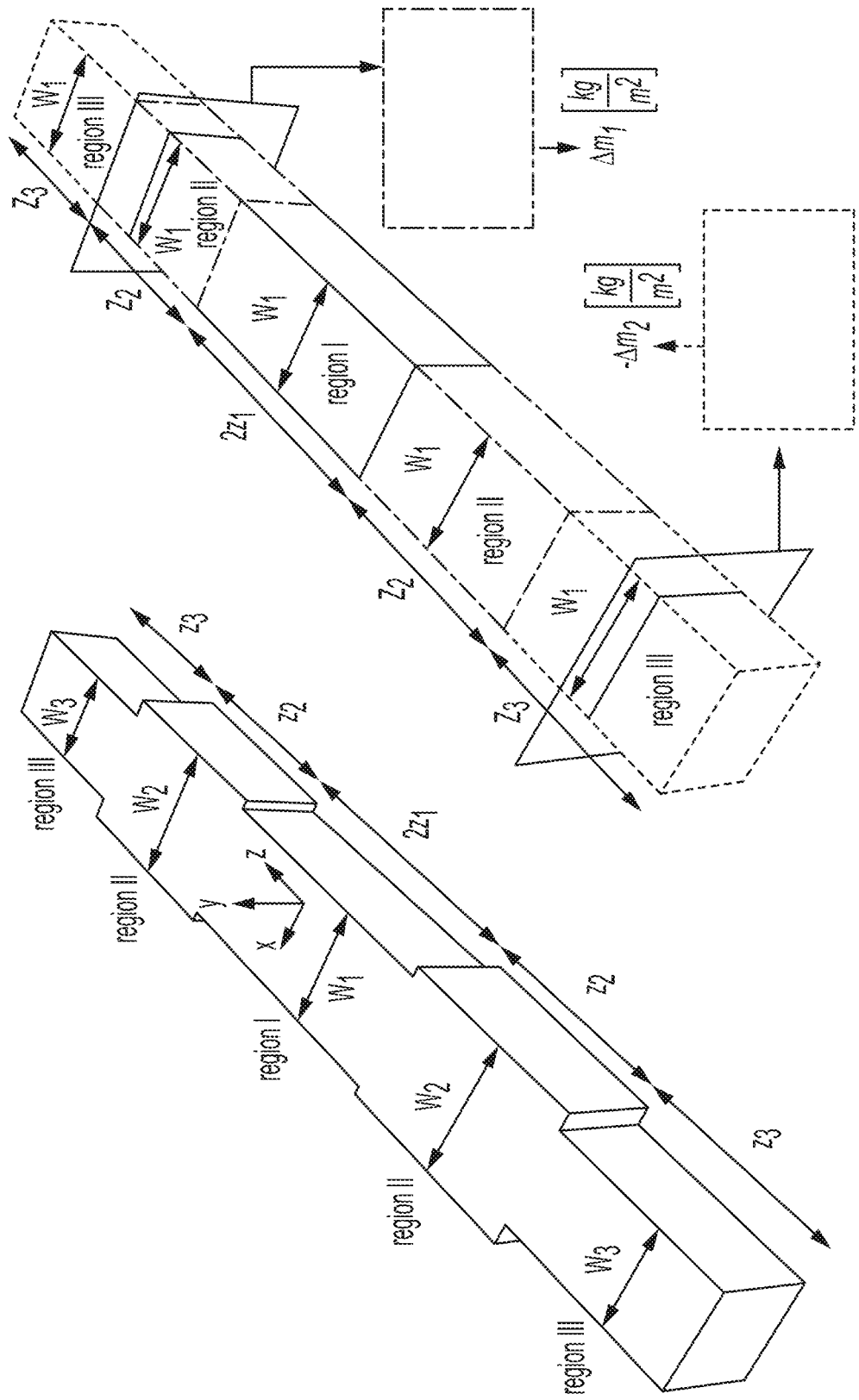

Silicon-on-insulator (SOI) substrate
20μm

Mo / AlN / Mo magnetron sputtering
50nm
500nm
50nm

Patterning input / output electrodes

Etching AlN to access bottom Mo

Etching trenches in AlN / Mo / Si stack

Device release: etching handle and BOX layer

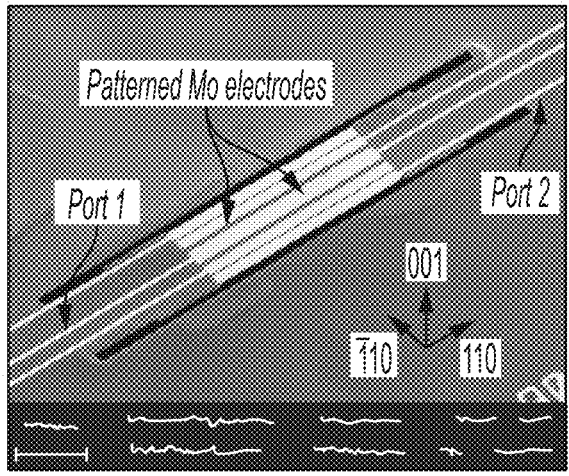
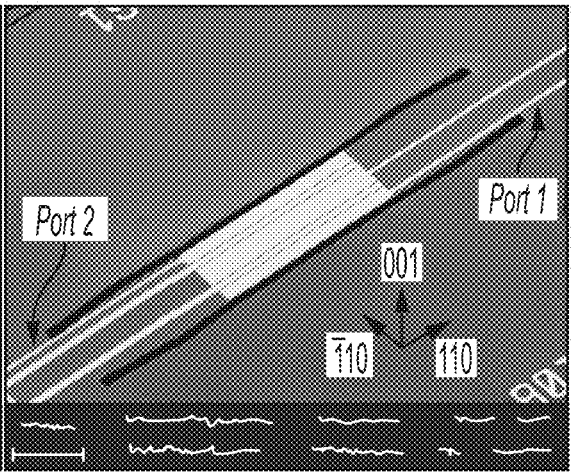
FIG. 14A  FIG. 14B
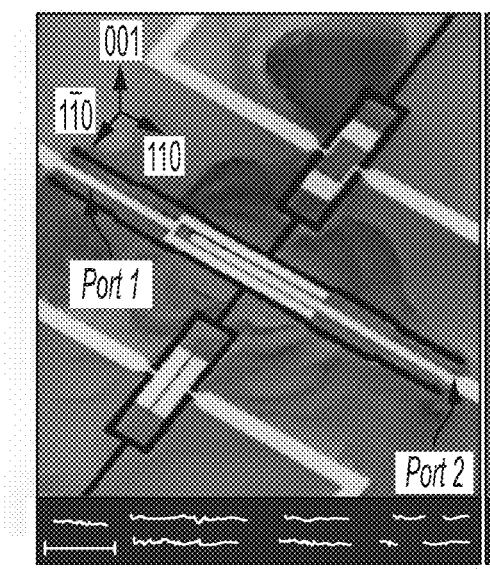
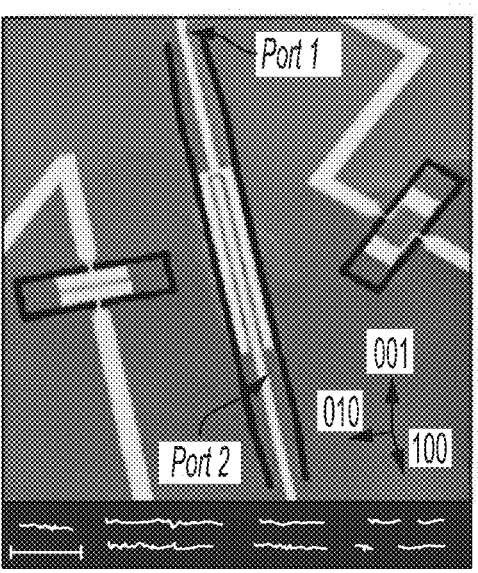
FIG. 14C  FIG. 14D

LAMB WAVE RESONATORS IN SINGLE-CRYSTAL SUBSTRATE

CROSS-REFERENCES TO RELATED APPLICATIONS

This application claims priority to Provisional Application No. 62/782,056, filed Dec. 19, 2018, which is incorporated herein by reference in its entirety.

TECHNICAL FIELD

The present application relates to acoustic resonators, in particular, to high Q Silicon wave resonators.

BACKGROUND

The emerging 5G wireless communication systems target operation in multi-band carrier aggregation schemes to fulfill the ever-growing need for higher data rates and communication capacity. To realize multi-band wireless systems there is an urgent need for high quality-factor (Q) resonator technologies with lithographical frequency definition. These resonators enable single-chip integration of radio frequency front-end filters and frequency references needed for configurable data communication over a wide frequency spectrum. Various micromechanical resonator technologies operating in in-plane vibration modes are introduced and developed over the past decade to provide the required lithographical frequency scalability. Although conceptually capable, these technologies are handicapped to provide an analytical design methodology that sustains the major resonator performance metrics, e.g., high Q and electromechanical coupling coefficient ($kt^2$), over extreme frequency scaling and within current fabrication limitations.

However, the forthcoming 5G era, with the ambitious target of the extending wireless communication to the mm-wave regime, has raised an unprecedented urgency for transformation of piezoelectric films and acoustic resonator architectures. To fulfill the demand for extreme frequency scaling to mm-wave regime, the quest for material and architectural improvements of the acoustic resonator technology continues. While the development of fin-based resonator architectures and the use of single crystal films and substrates help further the scaling limits beyond the current state, the ultimate bound of the frequency scaling is set by the technological limitations in piezoelectric film thickness miniaturization. Because the frequencies of bulk acoustic resonators are inversely proportional to the thickness of the piezoelectric film, extreme frequency scaling to mm-wave regime requires radical thickness miniaturization to sub-100 nm range. Such a miniaturization is substantially inhibited by the size requirements of nucleation, crystallization, and texture development processes in current piezoelectric film deposition techniques (e.g. Magnetron-Sputtering and Metalorganic Vapor-Phase Epitaxy or MOCVD), which drastically degrade the electromechanical coupling and energy dissipation coefficients.

BRIEF SUMMARY

Embodiments of the current disclosure provide a high Q dispersive acoustic waveguide, comprising: a substrate; a first portion, two second portions formed at two opposing ends of the first portion respectively, and two third portions formed coaxially at outer ends of the two second portions respectively; wherein the first, second and third portions are disposed on the substrate; wherein the first portion has a first width W1, the second portions each has a second width W2, and the third portions each has a third width W3; wherein the first width differs from the second width, the second width differs from the third width; and wherein the waveguide is characterized with gradual width changes at locations where the first portion joins one of the second portions, and one of the second portions joins one of the third portions. The substrate is a single crystal silicon on a Si-on-insulator wafer in either <100> or <110> crystallographic orientation. The waveguide has 20 μm-thick single crystal silicon with 500 nm aluminum nitride film on the single crystal silicon.

Embodiments of the current disclosure also provide a method of fabricating a high Q dispersive acoustic waveguide, comprising: providing a silicon on insulator substrate, wherein the silicon is in <100> or <110> crystalline orientation; depositing a first Molybdenum (Mo) film on a top surface of the silicon on insulator substrate; depositing an aluminum nitride (AlN) film on the first Mo film; depositing a second Mo film on the AlN film; patterning input and output electrodes on the second Mo film; etching trenches surrounding dispersive acoustic waveguide through the AlN film, the first Mo, and the Si; until the insulator is exposed, and releasing the dispersive acoustic waveguide by removing the silicon under the insulator and the insulator under the waveguide.

Optionally, the method further forming the first, the second, and the third portions each at different widths.

Optionally, the different widths are formed with an abrupt width change.

Optionally, the different widths are formed with a gradual width change.

BRIEF DESCRIPTION OF DRAWINGS

FIG. 1A shows a waveguide having a rectangular cross-section, according to an embodiment of the present invention.

FIGS. 1B-C illustrate modes of different waves propagating in the waveguide of FIG. 1A, according to an embodiment of the present invention.

FIGS. 2A-C illustrate extracted dispersion characteristics in width and surface mass for the propagating wave in the waveguide of FIG. 1A, according to an embodiment of the present invention.

FIGS. 3A-C illustrate dispersion-engineered waveguides, each is composed of three regions and shows different dispersion characteristics, according to some embodiments of the present invention.

FIGS. 14A-D demonstrate SEM images of the fabricated device in the AlN-on-Si substrate, according to an embodiment of the present invention.

DETAILED DESCRIPTION

Figure 2C:
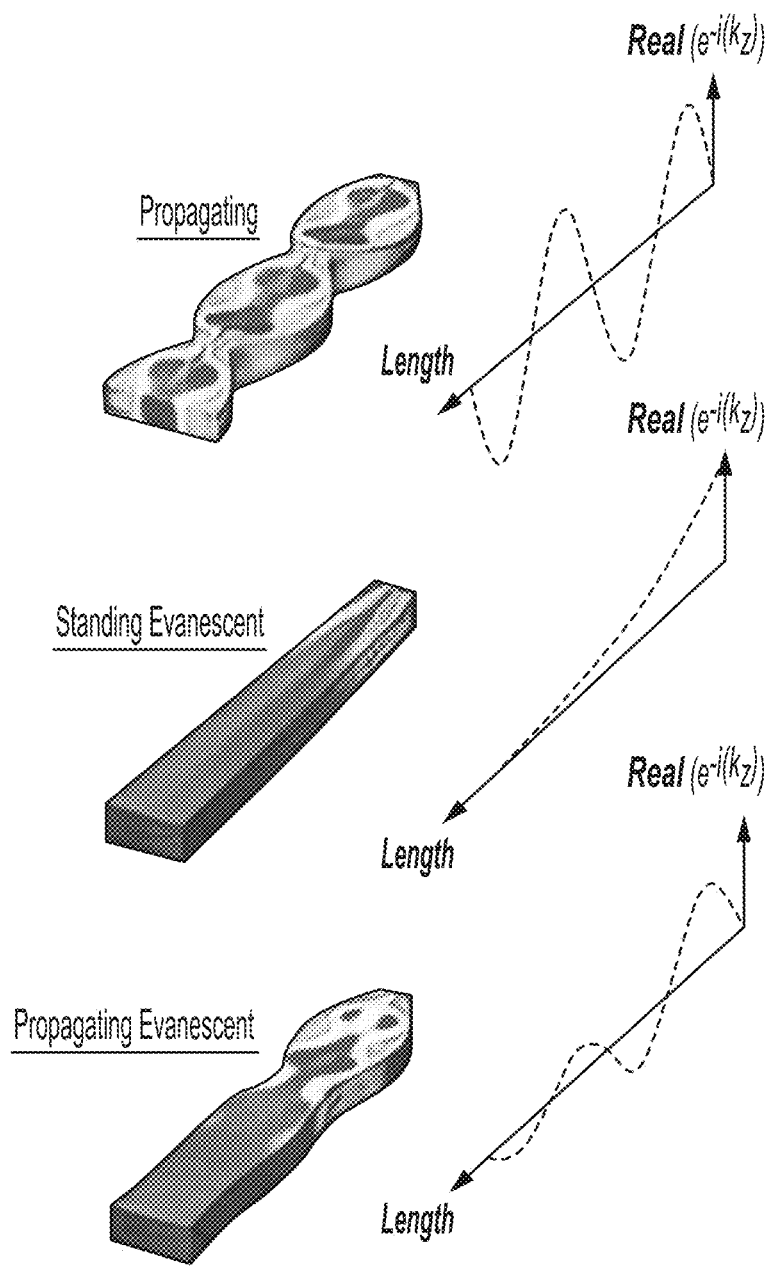

It should be understood that the examples and embodiments described herein are for illustrative purposes only and that various modifications or changes in light thereof will be suggested to persons skilled in the art and are to be included within the spirit and purview of this application.

Such alterations, modifications, and improvements are intended to be part of this disclosure and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," and/or the like, in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

To reduce the impact of Q degradation over extreme frequency scaling, a recent wave of research and development has targeted the use of single-crystal substrates and films that offer substantially lower acoustic dissipation compared to sputtered piezoelectric films, to enable realization of high-performance filters, duplexers, and frequency references over and beyond the ultra-high-frequency (UHF) regime. Besides opting for low-loss substrates, a frequency scalable design strategy that enables uniform acoustic energy localization within the electromechanical transduction area is the fundamental requirement for realization of resonators with high Q and $kt^2$ over a wide spectrum of interest.

Since the advent of in-plane micromechanical resonators, the design approaches target energy localization of bulk acoustic waves (BAW) in geometrically suspended microstructures. Such a suspension is realized through definition of stress-free or fixed boundaries surrounding a released microstructure. In these approaches, the vibration mode shape must contain a naturally formed or an artificially forced nodal point, line, or face to facilitate anchoring the resonator to the surrounding substrate through narrow tethers or clamped surfaces. In practice, these methods are bounded to lower frequency resonators by the scalability limit of narrow tethers connected to nodal points, or formation of ideal rigid anchors for facial clamping. Furthermore, these techniques are not systematically scalable to all resonators on the same substrate since changing the lateral frequency-defining dimensions, while having a constant thickness, induces substantial transformation of the vibration modes. This transformation may exclude the desired nodal point or degrade electromechanical transduction efficiency; hence, imposing the need for customized geometrical and transducer design for each specific frequency.

In accordance with one aspect of the present invention, a technique, based on dispersion characteristics of Lamb waves in an anisotropic single-crystal substrate, is proposed that enables systematic design of high-Q resonators with arbitrary cross-sectional mode shapes and resonator frequencies. The Lamb wave dispersion relation is derived for rectangular waveguides implemented in anisotropic single-crystal waveguides with a rectangular cross-section. The identified dispersive propagating and evanescent waves can be used for designing high Q and $kt^2$ resonator through efficient energy localization without the need for geometrical suspension. The resulting dispersion-engineered resonators are anchored through wide tethers that encompass negligible mechanical energy density; hence, reducing anchoring energy leakage, while enhancing power-handling and linearity. Furthermore, such wide tethers enable integration of multiple electrodes for simultaneous multi-mode excitation or heterogeneous integration with transistors to realize resonant body electronic components.

Harmonic excitations in a long waveguide with finite cross-sectional dimensions are limited to a discrete set of propagating and standing waves, e.g., Lamb waves, with specific frequencies and wavenumbers. The linear superposition of Lamb waves at a specific frequency can form a vibration mode, when the waveguide is properly terminated at the two ends. Therefore, identification of the Lamb waves and their dispersion characteristic (e.g., the relation between their frequency and wavenumber), along with proper termination of the waveguide enable analytical synthesis of vibration modes.

FIG. 1A shows a waveguide along Z direction having a rectangular cross-section, in the plane of X-Y, in which H and W represent the height and width of its rectangular cross-section. FIGS. 1B-C illustrates the many cross-sectional mode patterns for different orders in the Lamb waves. FIG. 1B has the lateral first standing wave. FIG. 1C has the second order standing wave. Equation (1) is the equation of motion.

Referring to FIG. 1A, for a waveguide with a rectangular cross-section implemented in an anisotropic single-crystal solid material, for example, in a silicon crystal, wave propagation dynamics are governed by the equation of motion, limited by the stress-free boundary condition at the peripheral faces, and is mathematically defined through the following equation:

$$\begin{cases} \nabla \cdot C : \nabla \vec{U} = \rho \dfrac{\partial^2 \vec{U}}{\partial t^2} \\ B \cdot C \cdot (1) : \sigma_{i=1,5,6}\left(\pm \dfrac{W}{2}, y, z\right) = 0 \\ B \cdot C \cdot (2) : \sigma_{i=2,4,6}\left(x, \pm \dfrac{H}{2}, z\right) = 0 \end{cases} \quad \text{Eq. (1)}$$

Here, $\vec{U}(x,y,z)$ is the three-dimensional displacement vector; $\nabla\cdot$ is the divergence operator matrix defined by this equation (2):

$$\nabla \cdot = \begin{bmatrix} \dfrac{\partial}{\partial x} & 0 & 0 & 0 & \dfrac{\partial}{\partial z} & \dfrac{\partial}{\partial y} \\ 0 & \dfrac{\partial}{\partial y} & 0 & \dfrac{\partial}{\partial z} & 0 & \dfrac{\partial}{\partial x} \\ 0 & 0 & \dfrac{\partial}{\partial z} & \dfrac{\partial}{\partial y} & \dfrac{\partial}{\partial x} & 0 \end{bmatrix}. \quad \text{Eq. (2)}$$

where $\nabla$ is the gradient matrix operator, which is the transpose of $\nabla\cdot$ (e.g., $\nabla\cdot=\nabla^T$). C is the elastic constant matrix for an arbitrary anisotropic material along major crystal axis, in Voigt notation Eq. (3):

$$C = \begin{bmatrix} c_{11} & c_{12} & c_{13} & 0 & 0 & 0 \\ c_{12} & c_{22} & c_{23} & 0 & 0 & 0 \\ c_{13} & c_{23} & c_{33} & 0 & 0 & 0 \\ 0 & 0 & 0 & c_{44} & 0 & 0 \\ 0 & 0 & 0 & 0 & c_{55} & 0 \\ 0 & 0 & 0 & 0 & 0 & c_{66} \end{bmatrix}. \quad \text{Eq. (3)}$$

Where $\rho$ is the mass density; $\sigma_i$ (i=1, 2, . . . 6) are the components of stress vector in Voigt notation; finally, H and W are the height and width of the cross-section of the waveguide that is centrosymmetric to origin and is extended in Z direction, as shown in FIG. 1A.

Equation (1) can be solved for displacement vectors of $\vec{U}=\vec{\Gamma}(x,y)e^{i(kz-wt)}$ to identify the cross-sectional vibration vector, (e.g., $$\vec{\Gamma}(x, y) = \begin{bmatrix} U_x(x, y) \\ U_y(x, y) \\ U_z(x, y) \end{bmatrix})$$

and the corresponding frequency-wavenumber pair (e.g., ($\omega$, k)) of the allowed harmonic and collective excitations in the waveguide. Such a solution set defines the dispersion characteristics of the Lamb waves in the waveguide.

The dispersion characteristic of the Lamb waves in isotropic plate waveguides (e.g., W→∞) can be analytically extracted using the displacement potentials. In this approach, the propagation dynamics of extensional and shear constituents of the Lamb waves can be uncoupled, resulting in straightforward derivation of a closed form dispersion relation. Unlike in an isotropic solid, in anisotropic waveguides dynamics of extensional and shear waves are inherently coupled. Therefore, a similar approach is not applicable for extraction of dispersion relations in anisotropic waveguides. This section presents the formulation for extraction of the dispersion relation for symmetric Lamb waves in waveguides implemented in anisotropic single-crystal substrates. The equation of motion in Eq. (1) is solved for the two extreme cases of plane-strain (e.g., H/W→∞) and plane-stress (e.g., H/W→0). These conditions reduce the complexity of wave dynamics and facilitate derivation of closed-form dispersion relations.

A. Plane-Strain (H/W→∞)

In the plane-strain case, the displacement in y-direction nulls out.

Therefore the cross-sectional vibration vector is reduced to $$\vec{\Gamma}(x, y) = \begin{bmatrix} U_x(x, y) \\ 0 \\ U_z(x, y) \end{bmatrix},$$

Furthermore, the boundary condition of Eq. (1) is limited to $$\sigma_{i=1,5,6}\left(\pm \dfrac{w}{2}, y, z\right) = 0$$

Therefore, in the plane-strain case, Eq. (1) reduces to a system of two coupled complex differential equations $$\begin{cases} \dfrac{\partial^2 U_x}{\partial x^2} + \left(\dfrac{\rho\omega^2 - c_{55}k^2}{c_{11}}\right)U_x + \left(ik\dfrac{c_{13}+c_{55}}{c_{11}}\right)\dfrac{\partial U_z}{\partial x} = 0 \\ \dfrac{\partial^2 U_z}{\partial x^2} + \left(\dfrac{\rho\omega^2 - c_{33}k^2}{c_{55}}\right)U_z + \left(ik\dfrac{c_{13}+c_{55}}{c_{55}}\right)\dfrac{\partial U_x}{\partial x} = 0 \end{cases} \quad \text{Eq. (4)}$$

The harmonic solution space for the system of differential equations in Eq. (4) includes the following symmetric cross-sectional vibration modes:

$$\begin{cases} U_x = f_1 A_x \sin(p_1 x) - if_2 A_z \sin(p_2 x) \\ U_z = if_3 A_x \cos(p_1 x) - f_4 A_z \cos(p_2 x) \end{cases}, \quad \text{Eq. (5)}$$

$$(c_{11}p^2 - \rho\omega^2 + c_{55}k^2)(c_{55}p^2 - \rho\omega^2 + c_{33}k^2) = p^2k^2(c_{13}+c_{55})^2 \quad \text{Eq. (6),}$$

and $f_i$ (i=1-4) are related through:

$$\begin{cases} \dfrac{f_1}{f_3} = \dfrac{(c_{55}p_1^2 - \rho\omega^2 + c_{33}k^2)}{p_1 k(c_{13}+c_{55})} \\ \dfrac{f_2}{f_4} = \dfrac{(c_{55}p_2^2 - \rho\omega^2 + c_{33}k^2)}{p_2 k(c_{13}+c_{55})} \end{cases}. \quad \text{Eq. (7)}$$

$$\begin{bmatrix} (c_{11}f_1 p_1 - c_{13}f_3 k)\cos\left(\pm p_1 \dfrac{w}{2}\right) & i(-c_{11}f_2 p_2 + c_{13}f_4 k)\cos\left(\pm p_2 \dfrac{w}{2}\right) \\ i(f_1 k - f_3 p_1)\sin\left(\pm p_1 \dfrac{w}{2}\right) & (f_1 k - f_3 p_1)\sin\left(\pm p_1 \dfrac{w}{2}\right) \end{bmatrix} \begin{bmatrix} A_x \\ A_z \end{bmatrix} = \begin{bmatrix} 0 \\ 0 \end{bmatrix}, \quad \text{Eq. (8)}$$

$$\det\begin{bmatrix} (c_{11}f_1 p_1 - c_{13}f_3 k)\cos\left(\pm p_1 \dfrac{w}{2}\right) & i(-c_{11}f_2 p_2 + c_{13}f_4 k)\cos\left(\pm p_2 \dfrac{w}{2}\right) \\ i(f_1 k - f_3 p_1)\sin\left(\pm p_1 \dfrac{w}{2}\right) & (f_2 k - f_4 p_2)\sin\left(\pm p_2 \dfrac{w}{2}\right) \end{bmatrix} = 0. \quad \text{Eq. (9)}$$

$$\dfrac{\tan\left(p_2 \dfrac{w}{2}\right)}{\tan\left(p_1 \dfrac{w}{2}\right)} = \dfrac{(c_{11}f_2 p_2 - c_{13}f_4 k)(f_2 k - f_3 p_1)}{(c_{11}f_1 p_1 - c_{13}f_3 k)(f_1 k - f_4 p_2)}. \quad \text{Eq. (10)}$$

wherein, p1 and p2 are the characteristic roots defined by Applying the boundary conditions at the stress-free peripheral faces of the waveguide $$\left(\text{e.g., } \sigma_{i=1,5,6}\left(\pm \dfrac{w}{2}, y, z\right) = 0\right)$$

to the solution in Eq. (5) yields Eq. (8). To have non-zero solutions for $$\begin{bmatrix} A_x \\ A_z \end{bmatrix},$$

Eq. (9) should hold true, which further yields the dispersion relation given by Eq. (10).
)
B. Plane-Stress (H/W→0)

$$\begin{cases} \dfrac{\tan\left(p_2 \dfrac{w}{2}\right)}{\tan\left(p_1 \dfrac{w}{2}\right)} = \dfrac{\left(\left(c_{11} - \dfrac{c_{13}^2}{c_{11}}\right)f_2 p_2 - \left(c_{13}+c_{55}-\dfrac{c_{13}^2}{c_{11}}\right)f_4 k\right)(f_2 k - f_3 p_1)}{\left(\left(c_{11} - \dfrac{c_{13}^2}{c_{11}}\right)f_1 p_1 - \left(c_{13}+c_{55}-\dfrac{c_{13}^2}{c_{11}}\right)f_3 k\right)(f_1 k - f_4 p_2)} \\ \left(\left(c_{11}-\dfrac{c_{13}^2}{c_{11}}\right)p^2 - \rho\omega^2 + c_{55}k^2\right)\left(c_{55}p^2 - \rho\omega^2 + \left(c_{33}-\dfrac{c_{13}^2}{c_{33}}\right)k^2\right) = p^2 k^2\left(c_{13}+c_{55}-\dfrac{c_{13}^2}{c_{33}}\right)\left(c_{13}+c_{55}-\dfrac{c_{13}^2}{c_{13}}\right) \\ \dfrac{f_1}{f_3} = \dfrac{\left(\left(c_{13}+c_{55}-\dfrac{c_{13}^2}{c_{11}}\right)p_1^2 - \rho\omega^2 + \left(c_{33}-\dfrac{c_{13}^2}{c_{33}}\right)k^2\right)}{p_1 k\left(c_{13}+c_{55}-\dfrac{c_{13}^2}{c_{11}}\right)}, \\ \dfrac{f_2}{f_4} = \dfrac{\left(\left(c_{13}+c_{55}-\dfrac{c_{13}^2}{c_{11}}\right)p_2^2 - \rho\omega^2 + \left(c_{33}-\dfrac{c_{13}^2}{c_{33}}\right)k^2\right)}{p_2 k\left(c_{13}+c_{55}-\dfrac{c_{13}^2}{c_{11}}\right)} \end{cases} \quad \text{Eq. (11)}$$

In the plane-stress case, stress-components in y-direction are zero $$\left(\text{e.g., } \sigma_{i=2,4,6}\left(x, \pm \dfrac{H}{2}, y, z\right) = 0\right).$$

dispersion relation given by Eq. (11). The complexity of dispersion relation in anisotropic plate and waveguide is clear when compared to the isotropic plates that is derived as:

$$\begin{cases} \dfrac{\tan\left(p_2 \dfrac{w}{2}\right)}{\tan\left(p_1 \dfrac{w}{2}\right)} = \dfrac{-4k^2 p_1 p_2}{(p_2^2 - k^2)} \\ p_1 = \sqrt{\dfrac{\rho\omega^2}{c_{11}} - k^2}, \ p_2 = \sqrt{\dfrac{\rho\omega^2}{(c_{11}-c_{12})/2} - k^2} \end{cases} \quad \text{Eq. (12)}$$

A MATLAB code, based on bisection method, is used to extract the dispersion diagram (e.g., (f=ω/2π, k) from Eq. (10) and Eq. (11).

FIGS. 2A-C illustrate extracted dispersion characteristics for the three symmetric modes in a waveguide with 50 μm width, for plane stress and plane strain cases in FIG. 2A <100> crystallographic orientation of (100) single crystal silicon substrate, and in FIG. 2B <110> crystallographic orientation of (100) single crystal silicon substrate. Apart from the propagating waves with real wavenumber ($k_z$=k; k∈ℝ), $S_0$ represent standing-evanescent waves with pure imaginary wave numbers ($k_z$=ik); k∈ℝ. $S_1$ and $S_2$ has an additional branch of propagating-evanescent wave with complex wavenumbers ($k_z$=$k_1$+i$k_2$; $k_1$ & $k_2$∈ℝ) originating from the zero-group velocity point of the branch. In FIG. 2C it corresponds to vibration mode shapes to the propagating, standing-evanescent and propagating-evanescent waves for $S_1$ branch, along with their axial propagation function across the waveguide length.

FIGS. 2A and 2B demonstrate the extracted dispersion diagram for the first three branches of symmetric Lamb waves for plane-stress and plane-strain cases, for waveguides with 50 μm width and aligned to <100> and <110> crystallographic orientation of (100) silicon plate. It is evident that apart from the $S_0$ Lamb waves that originate at (f,k) (0,0), other symmetric modes have imaginary and/or complex wavenumbers. Also, it is worth noting that while $S_0$ and $S_2$ follow type-I dispersion characteristics, S1 exhibits type-II dispersion characteristics up to the Lamb wave with zero group-velocity $$\left(\text{e.g., } k = k_{ZG} \text{ where } \left.\dfrac{\partial f}{\partial k}\right|_{k=k_{ZG}} = 0\right).$$

For $S_1$ Lamb waves with k>$k_{ZG}$, $S_1$ manifests type-I dispersion. Finally, there exist an extension to the $S_1$ branch, originating from $k_{ZG}$, that represent wavenumbers with complex values (hence called complex branch, hereafter) and meets f=0 plane perpendicularly. Therefore, extraction of the Lamb waves dispersion characteristic in anisotropic single-crystal waveguides identifies three categories of propagating and evanescent solutions: (1) the propagating waves with real wavenumber $k_{=kreal}$; (2) standing-evanescent waves with purely imaginary wave number k=i$k_{imag}$; and (3) propagating-evanescent waves with complex wavenumbers k=$k_{real}$+i$k_{imag}$. The displacement function of these three categories are schematically shown in FIGS. 2A-C.

The existence of evanescent solutions provides an acoustic means for energy localization without the need for geometrical suspension. The following section presents an analytical design procedure for synthesis of high-Q resonators using propagating and evanescent Lamb waves in anisotropic waveguides.

Dispersion Engineering for Acoustic Energy Localization

As evident in dispersion diagrams shown in FIGS. 2A-2C, except the $S_0$ branch that initiates from the origin of $(\omega,k)$ space, corresponding branches to other Lamb waves include both propagating (e.g., $k \in \mathbb{R}$) and standing-evanescent (e.g., $ik \in \mathbb{R}$) sections. Furthermore, in some cases such as the $S_1$ branch, there exist an extension representing propagating-evanescent waves with complex wavenumber (e.g., $k=k_1+ik_2$; $k_1$ & $k_2 \in \mathbb{R}$).

A set of Lamb waves with different cross-sectional patterns, $\vec{\Gamma}_i(x,y)$, can be simultaneously excited at a specific frequency to form a standing vibration mode. In a generic definition, a three-dimensional standing vibration mode, $\vec{\Gamma}(x, y, z, t)$, is created through linear superposition of bi-directional propagating and propagating-evanescent waves, in addition to standing-evanescent waves:

$$\vec{\Gamma}(x,y,z,t)=\text{Re}\{\Sigma_m A_m$$
$$\vec{\Gamma}_m(x,y)[e^{i(k_m z-\omega t)}+e^{i(-k_m z-\omega t)}]+\Sigma_n B_n$$
$$\vec{\Gamma}_n(x,y)e^{-k_n z}e^{i(-\omega t)}+\Sigma_p B_p \vec{\Gamma}_p(x,y)e^{k_p z}e^{i(-\omega t)}\} \quad \text{Eq. (13)}$$

Here, $A_m$, and $B_{n,p}$ are the weighting coefficients for the propagating/propagating-evanescent and standing-evanescent waves respectively and are defined by excitation scheme (e.g., distribution and placement of excitation sources). The weighting coefficients can be engineered with proper transduction schemes and waveguide termination strategies to ensure suppression of undesired Lamb waves or reduce their corresponding amplitude; hence, limiting the excitations to a specific Lamb wave with desired cross-sectional pattern. In this case, Eq. (13) can be simplified to:

$$\vec{\Gamma}_i(x,y,z,t)=\vec{\Gamma}_i(x,y)\Psi_i(z)\cos(\omega t) \quad \text{Eq. (14)}$$

Here, $\Psi_i(z)$, is the axial mode shape defined by:

$$\Psi_i(z)=A_i \cos(k_{i,1}z)+B_i e^{-k_{i,2}z}+C_i \cos(k_{i,3}z)e^{-k_{i,4}z} \quad \text{Eq. (15)}$$

wherein, $k_{i,1}$, $ik_{i,2}$ and $k_{i,3}+ik_{i,4}$ are the wavenumbers of the propagating, standing-evanescent and propagating-evanescent Lamb waves corresponding to the dispersion branch of interest, at frequency $\omega$. Also, depending on the extension of the corresponding dispersion branch in $(\omega,k)$ space, one or all of the weighting constants may vanish. Finally, Eq. (15) assumes the placement of a centrosymmetric excitation source at the origin.

While the axial mode shape $\Psi_i(z)$ is extended infinitely over the length of the waveguide, realization of a high-Q resonance mode requires energy localization in a finite length. This can be achieved through engineering the dispersion characteristic of the waveguide across its length, to nullify the weighting coefficient corresponding to propagating waves (e.g., A in Eq. (15)) in regions alongside the excitation source.

Figure 3C:
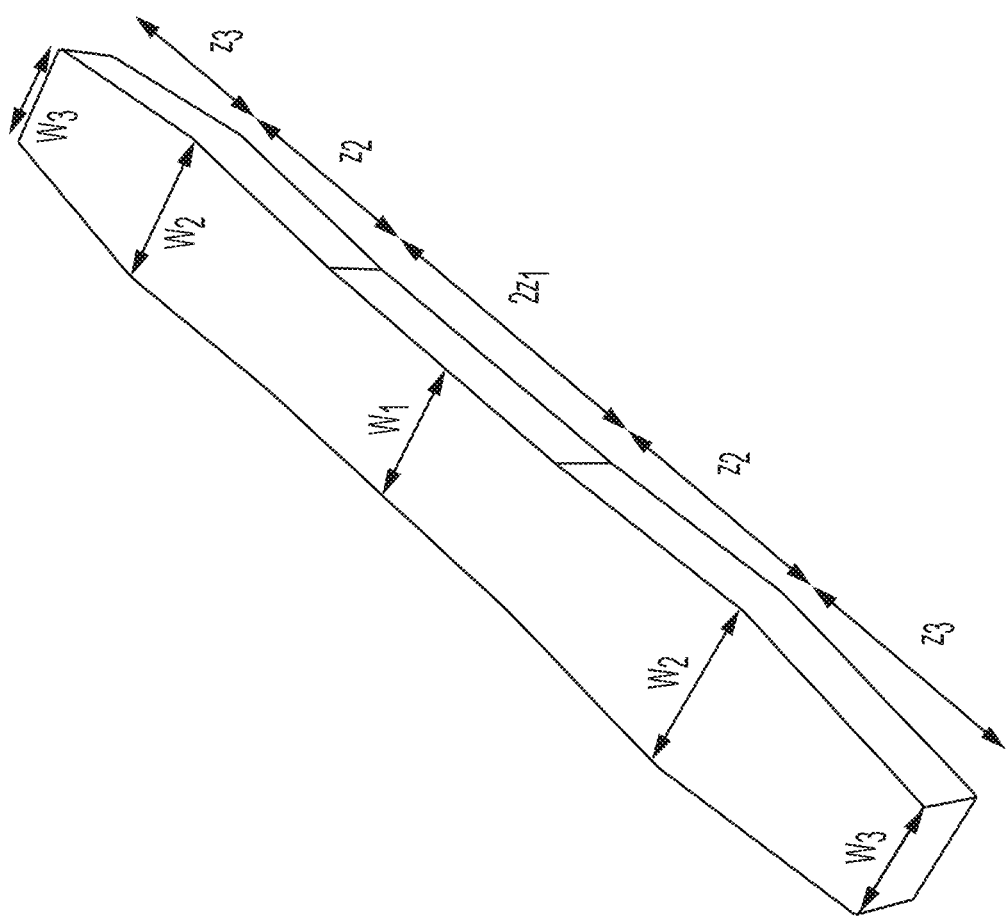

FIGS. 3A-3C illustrate a dispersion-engineered waveguide which is composed of three regions and each one has a different dispersion characteristic. FIG. 3A shows changing the width across the waveguide length abruptly. FIG. 3B shows the effect of material change by adding/removing surface-mass abruptly at the border of the regions along the waveguide. FIG. 3C shows the waveguide structure of varying materials by adding/removing surface-mass gradually across borders between two regions. The changing in waveguide width or material composition transforms the corresponding dispersion characteristic of the constituent regions and limits the solution space for harmonic excitations through imposing additional boundary conditions.

In FIGS. 3A-3B, the two waveguide configurations are used for acoustic energy localization of type I and II Lamb waves: FIG. 3A draws the waveguide with abrupt width variations and FIG. 3B draws the waveguide with abrupt material change in constituent regions, following the design procedure discussed above. FIG. 3C shows an alternative configuration that replaces abrupt variations/steps with gradually changing width over the waveguide length.

The dispersion characteristic of the Lamb waves depends on the elastic properties and mass density of the constituting materials, as well as the cross-sectional geometry of the waveguide. Therefore, any change in the cross-sectional dimensions or material composition results in a transformation of the dispersion curves. FIGS. 3A and 3B schematically demonstrate dispersion-engineered waveguides that are created by variations of the cross-sectional dimensions or introduction of peripheral mass-loading, across the waveguide length.

To formulate the Lamb wave dynamics, a dispersion-engineered waveguide can be interpreted as a set of rectangular waveguides with finite length that are acoustically coupled through cascading them in length direction. This coupling significantly limits the solution space for harmonic excitations by imposing additional boundary conditions to the constituent waveguides. The additional boundary conditions are the continuity of particle displacement and strain at the transitional faces between cascaded waveguides.

Considering an appropriate design that satisfies the boundary conditions, an axial mode-shape function $\Psi_i(z)$ of dispersion engineered waveguides can be formulated by:

$$\Psi_i(z) = \begin{cases} K_1 \Psi_{i,1}(|z|) & z \in \text{Region I} \\ K_2 \Psi_{i,2}(|z|-z_1) & z \in \text{Region II} \\ K_3 \Psi_{i,2}(|z|-z_1-z_2) & z \in \text{Region III} \end{cases} \quad \text{Eq. (16)}$$

wherein, $\Psi_{i,1-3}(z)$ are the axial mode-shape functions corresponding to constituent waveguides (e.g., regions I, II, and III), and $K_{1-3}$ are constants. Proper dispersion engineering of the waveguide can result in creation of vibration modes $\Psi_i(z)$ with evanescent constituents in regions II and/or III. Such modes benefit from the exponential decay in the axial mode-shape functions across the length, which enables acoustic energy localization in region I and without the need for geometrical suspension. This technique has been previously demonstrated in thickness-mode aluminum nitride (AlN) BAW resonators for enhancement of $k_t^2 \cdot Q$ and suppression of spurious modes, through engineering waveguide stack (e.g., addition of metallic border rings). In this disclosure, the required dispersion engineering is achieved through changing the width of the waveguide across its length. Unlike thickness-mode counterparts, the dispersion characteristics of Lamb waves with in-plane cross-sectional vibration pattern is highly sensitive to the waveguide width. Therefore, the desired dispersion engineering for acoustic energy localization can be achieved through simple lithographical variation of the waveguide geometry in the fabrication process without the need for addition of a new material. Depending on the dispersion type of the corresponding Lamb wave, different engineering strategies can be used to create high-Q resonance modes. In this section, two extensional Lamb waves with different dispersion types are used to demonstrate the energy localization and analytical mode synthesis concept.

A. Type-I Dispersion Engineering

Figure 4A:
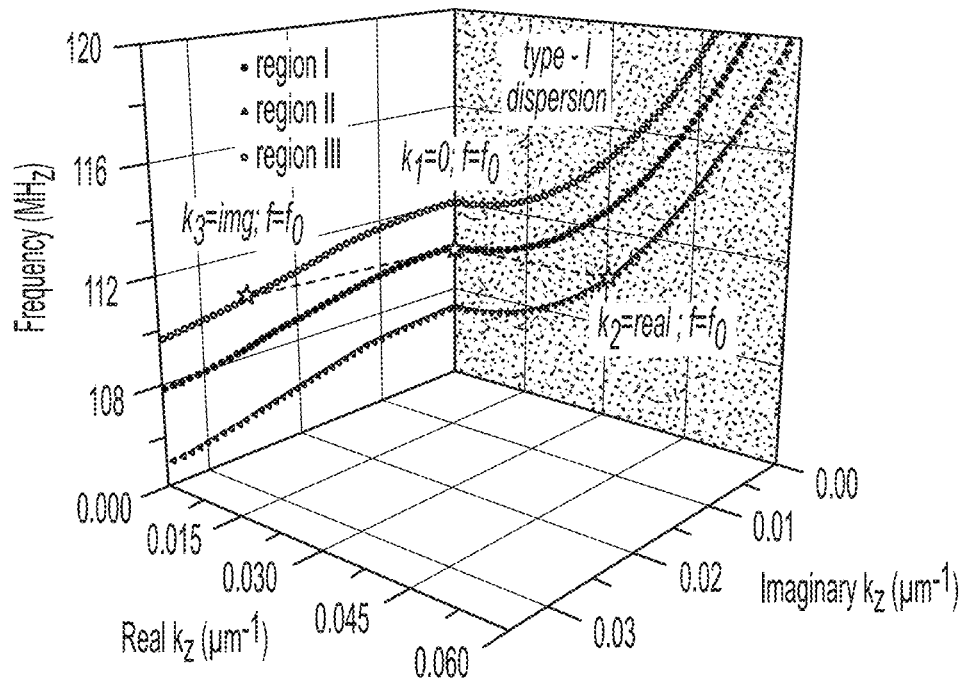
FIGS. 4A-B demonstrate the dispersion characteristics of the $1^{st}$ and 3rd width-extensional (WE) Lamb waves.
Figure 4B:
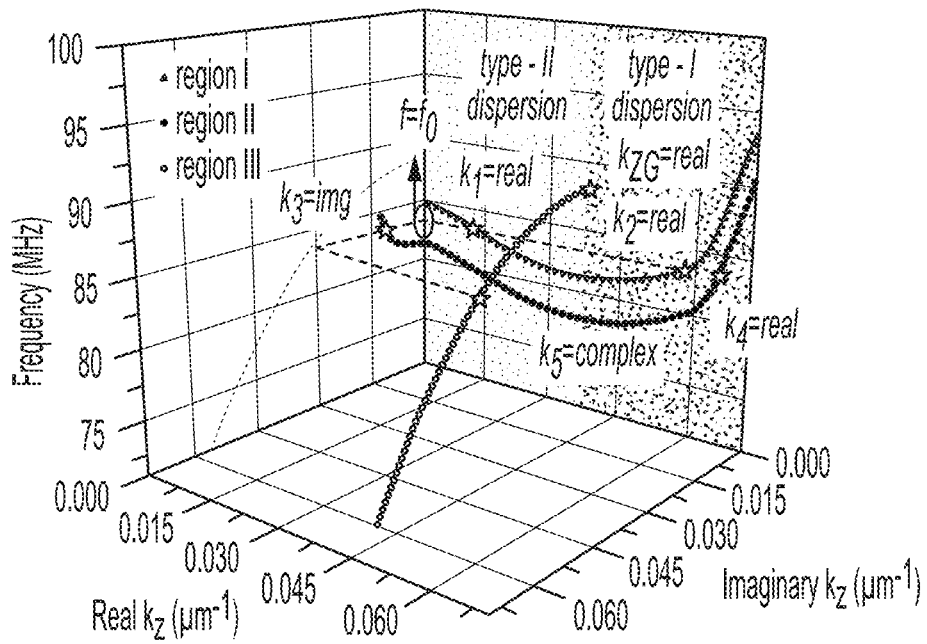

FIGS. 4A and 4B demonstrate that the dispersion characteristic of the $1^{st}$ and 3rd width-extensional (WE) Lamb waves for waveguides with different widths (e.g., W3<W1<W2) and 20 µm thickness from simulation results. As is evident, WE3 wave manifests dispersion type-I while WE1 wave shows type-II and type-I dispersion characteristics.

Changing the width of the waveguide transforms the dispersion characteristic of Lamb waves. The dispersion curves for $S_1$ wave is demonstrated for the three regions of the dispersion-engineered waveguide demonstrated in FIGS. 4A and 4B. The cross-plane at the frequency $f_0$ intersects dispersion branches at various points, highlighted by stars. These points correspond to propagating, standing-evanescent, and propagating-evanescent Lamb waves in regions I, II and III, according to an embodiment of the present invention. For the Lamb waves with dispersion type-I of FIG. 4A, acoustic energy localization can be achieved through enforcing the excitation of a standing-evanescent solution in region III at the desired operation frequency $f_0$; hence, yielding an exponentially decaying axial mode-shape function (e.g., $\Psi_{i,3}(|z|)=e^{-k_{i,3}(|z|-z_1-z_2)}$, $z \in$ Region III).

Furthermore, to ensure a uniform energy distribution in region I, where the transducer will be placed, the waveguide geometry should be engineered to enforce excitation of Lamb wave with infinitely long wavelength (e.g., k=0) in region I, hence yielding a constant mode-shape function (e.g., $\Psi_{i,1}=(|z|)=1$) and realizing a "piston-shaped" vibration mode at desired frequency $f_0$. Benefiting from uniform energy distribution in active transduction region, resonators with piston-shaped vibration modes provide enhanced $k_t^2$ and power-handling.

Finally, to satisfy the required displacement and strain continuity across the waveguide, $\Psi_{i,1}$ and $\Psi_{i,3}$ should be coupled through a propagating wave with finite wavelength (e.g., $0<k_2\in \mathbb{R}$) in region II (e.g., $\Psi_{i,2}=\cos(k_{i,2})$).

The analytical design procedure for synthesis of such vibration mode at a frequency $f_0$ consists of identification of the width and length of constituting regions (e.g., regions I, II, III). While the width of the region I (e.g., $W_1$) must be defined to ensure existence of a Lamb wave with k=0, the choice of $W_2$ and $W_3$ should only suffice the existence of propagating and standing-evanescent waves at $f_0$. The axial mode-shape function of the dispersion-engineered waveguide can be written as:

$$\Psi_{WE_3}(z) = \begin{cases} K_1 & z \in \text{I} \\ K_2\cos(k_{WE_3,2}(|z|-z_1)) & z \in \text{II} \\ K_3 e^{-k_{WE_3,3}(|z|-z_1-z_2)} & z \in \text{III} \end{cases} \quad \text{Eq. (17)}$$

where, $K_1$, $K_2$ and $K_3$ are the vibration amplitudes, and $k_{wE3,2}$ and $ik_{WE_3,3}$ are the corresponding wavenumbers for the Lamb waves at $f_0$ in regions II and III, respectively. $2z_1$, $z_2$ and $z_3$ denote the lengths of regions I, II and III in the engineered waveguide, with the origin for Eq. (17) being the center of the device in FIGS. 3A-3C.

Considering Eq. 17, the displacement continuity at the interface of regions II and III (e.g., $z=z_1+z_2$) requires:

$$K_2 \cdot \cos(k_{WE_3,2}(z_2))=K_3 \quad \text{Eq. (18).}$$

Similarly, the continuity of strain at the interface of the regions II and III requires:

$$K_2 \cdot k_{WE_3,2} \sin(k_{WE_3,2}(z_2))=K_3 \cdot k_{WE_3,3} \quad \text{Eq. (19).}$$

These system of equations (Eq. 17 and 18) result in a closed form solution to calculate the length of the region II as:

$$z_2 = \frac{1}{k_{WE_3,2}}\tan^{-1}\left(\frac{k_{WE_3,3}}{k_{WE_3,2}}\right). \quad \text{Eq. (20)}$$

Figure 5:
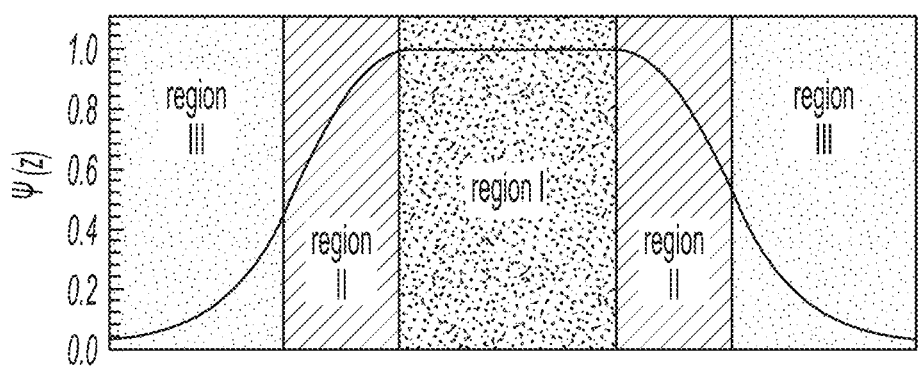
FIG. 5 shows the axial mode-shape function for the synthesized vibration mode with type-I dispersion characteristics, according to an embodiment of the present invention.

The length of the region III (e.g., $z_3$) is chosen appropriately long to help in sufficient decay of the energy profile thus realizing energy localization in region I, without the need for geometrical suspension. FIG. 5 shows the axial mode-shape function for the "piston-shaped" synthesized vibration mode using dispersion engineering for $WE_3$ Lamb wave with type-I dispersion characteristics, according to an embodiment of the present invention.

It is understood that in the piston-shaped mode, the length of central region (e.g., $2z_1$) is a degree of freedom and can be chosen depending on the requirement of transduction area or limitations for the overall form factor of the device.

B. Type-II Dispersion Engineering

In theory, a similar strategy that is discussed in section A can be used to create "piston-shaped" modes for Lamb waves with type-II dispersion. However, opting for this approach in single crystal silicon waveguides is challenging considering the limited range of wavenumbers in the standing-evanescent section of the branch.

Figure 6:
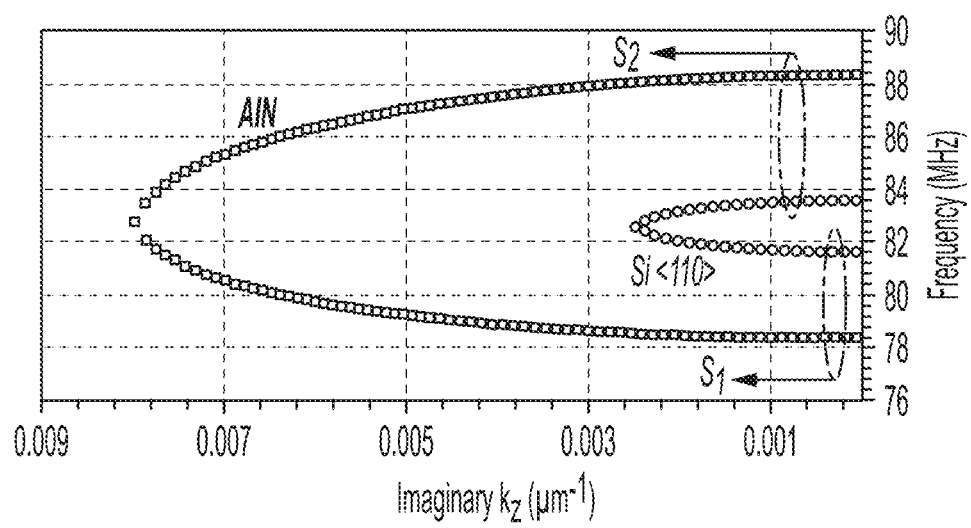
FIG. 6 shows a comparison of the dispersion characteristics of standing-evanescent S1 and S2 waves with similar frequencies in two different materials: Aluminum Nitrite (AlN) and Silicon <110> plates at k=0, according to an embodiment of the present invention.

FIG. 6 shows a comparison of the dispersion characteristics of standing-evanescent $S_1$ waves in Aluminum Nitride (AlN) and in Si <110> plates with similar frequencies at k=0. The maximum value for k in Si <110> is four-times smaller compared to AlN, according to an embodiment of the present invention.

It is evident that the maximum wavenumber in standing-evanescent section in Si <110> is $|k_{max,Si}| \approx 0.0024$ µm$^{-1}$, which is significantly smaller in magnitude compared to that of AlN (e.g., $|k_{max,AlN}| \approx 0.0082$ µm$^{-1}$). Such a small wavenumber translates to the slow rate of exponential decay in the amplitude of axial mode-shape function $\Psi(z)$ and imposes the need for very long flanks (e.g., region III waveguides) to sufficiently attenuate the acoustic energy density at the anchoring regions. Also, unlike the type-I case where region III can only support a standing-evanescent wave at $f_0$ in type-II dispersion characteristic the standing-evanescent waves are accompanied by propagating wave with large wavenumbers. This can also be observed back in FIG. 4B where a cut-plane at $f_0$ intersects the dispersion branch corresponding to the region III in two points with real and imaginary wavenumbers. These points highlighted through stars correspond to propagating and evanescent Lamb waves at $f_0$. The excitation of a propagating wave in region III is highly undesirable as it results in energy leakage out of the active region I, and reduce the resonator Q. Furthermore, anchoring/terminating region III at any point over its length leads to destructive reflection of the propagating wave back into the active region I. This reflection induces ripples in axial mode-shape function in region I; hence, resulting in degradation of $k_t^2$ and power-handling.

To surpass these challenges, an alternative energy localization technique can be used through exploiting the propagating-evanescent extension of the S1-branch (e.g., $k=k_1+ik_2$; $k_1 \& k_2 \in \mathbb{R}$). In this technique a propagating wave with small wavenumber in region I is coupled to a propagating-evanescent wave in region III, through a standing-evanescent wave in region II; hence, resulting in a unique vibration mode with efficient energy localization.

Opting for proper width on region III, the dispersion characteristic of the Lamb wave can be engineered to have a complex wavenumber with large imaginary part at the desired frequency $f_0$. Benefiting from much large imaginary part compared to standing-evanescent counterpart, propagating-evanescent waves enable energy localization in small form factors in single crystal silicon waveguides. Furthermore, the essential nature of propagating-evanescent waves facilitates formation of nodal points that may further help to reduce the overall length of the region III, while sustaining a high Q. FIG. 4B demonstrates the respective dispersion characteristics of 1st WE Lamb wave in <100> silicon waveguides with different widths (e.g., W3<W1<W2) that represents type-II dispersion.

The analytical design procedure to realize a resonator at frequency $f_0$ consists of identification of the width and length of constituting regions, I-III. Similar to dispersion type-I counterparts, $W_2$ should be chosen to ensure the existence of standing-evanescent wave at $f_0$. Also, $W_3$ should be chosen to enforce the $f_{ZG}$ of $S_1$ branch to be larger than $f_0$, thus ensuring the existence of propagating-evanescent solution in region III at $f_0$. The axial mode-shape function ($\Psi_{WE_1}(Z)$) for the dispersion-engineered resonator operating in $WE_1$ mode can be written as:

$$\begin{cases} K_1 \cos(k_{WE_1,1} z) & z \in \text{I} \\ K_2 e^{-k_{WE_1,2}(|z|-z_1)} & z \in \text{II} \\ K_3 e^{-k_{WE_1,3}(|z|-z_1-z_2+z_0)} \cos(k_{ZG,3}(|z|-z_1-z_2+z_0)) & z \in \text{III} \end{cases} \quad \text{Eq. (21-a,b,c)}$$

where, $k_1$, $k_2$, and $k_3$ are the vibration amplitudes, and $k_{WE_1,1}$, $ik_{WE_1,2}$, and $k_{ZG,3}+k_{WE_1,1}$ are the corresponding wavenumbers for the Lamb waves at $f_0$ in regions I-III. Here $z_0$ is the auxiliary correction term to facilitate appropriate displacement and strain continuity over the waveguide length.

Considering Eq. 21-a, Eq. 21-b, the displacement continuity at the interface of regions I and II (e.g., $z=z_1$) requires:

$$K_1 \cdot \cos(k_{WE_1,1}(z_1)) = K_2 \qquad \text{Eq. (22)}.$$

Similarly, the continuity of strain at the interface of the regions I and II requires:

$$K_1 \cdot k_{WE_1,1} \sin(k_{WE_1,2}(z_1)) = K_2 \cdot k_{WE_1,2} \qquad \text{Eq. (23)}.$$

These system of equations (Eq. 22 and 23) result in a closed form solution to calculate the length of the region I as $$z_1 = \frac{1}{k_{WE_1,1}} \tan^{-1}\left(\frac{k_{WE_1,2}}{k_{WE_1,1}}\right). \qquad \text{Eq. (24)}$$

Considering Eq. 21-b and 21-c, the displacement continuity at the interface of regions II and III (e.g., $z=z_1+z_1$) requires:

$$K_2 e^{-k_{WE_1,2}(z_2)} = K_3 e^{-k_{WE_1,3}(z_0)} \cos(k_{ZG,3} z_0). \qquad \text{Eq. (25)}$$

Similarly, the continuity of strain at the interface of the regions II and III requires:

$$e^{-k_{WE_1,3}(z_0)} k_{ZG,3} \sin(k_{ZG,3} z_0). \qquad \text{Eq. (26)}$$

Replacing Eq. (24) in Eq. (25), $z_0$ can be calculated from:

$$z_0 = \frac{1}{k_{ZG,3}} \tan^{-1}\left(\frac{k_{WE_1,2} - k_{WE_1,3}}{k_{ZG,3}}\right) \qquad \text{Eq. (27)}$$

Also, considering Eq. (25) and Eq. (26), there is no unique solution for $z_2$; e.g., for any $z_2$ value, there exists a vibration amplitude $K_3$ to guarantee Eq. (25) and Eq. (26) hold.

Finally, $z_3$ is defined to benefit from the inherent nodal points of the propagating-evanescent Lamb wave in region III as:

$$k_{ZG,3}(z_3+z_0) n\pi/2 \qquad \text{Eq. (28)}.$$

Such a $z_3$ ensures a zero-displacement at the termination face of the waveguide, where it is anchored to the substrate.

It is worth noting that the proposed analytical design procedure for type-II dispersion targets energy localization through both evanescent waves in regions II and III, as well as geometrical suspension (e.g., nodal point) in region III. The relative contribution of the each of these techniques in the efficiency of energy localization and resonator Q can be deliberately controlled by z2. Propagating waves with large wavenumbers are in region I and II are ignore in Eq. 21 for the ease of analytical derivation of closed form solution. Numerical methods can be used to solve resulting equations considering waves with large wavenumbers.

Figure 7:
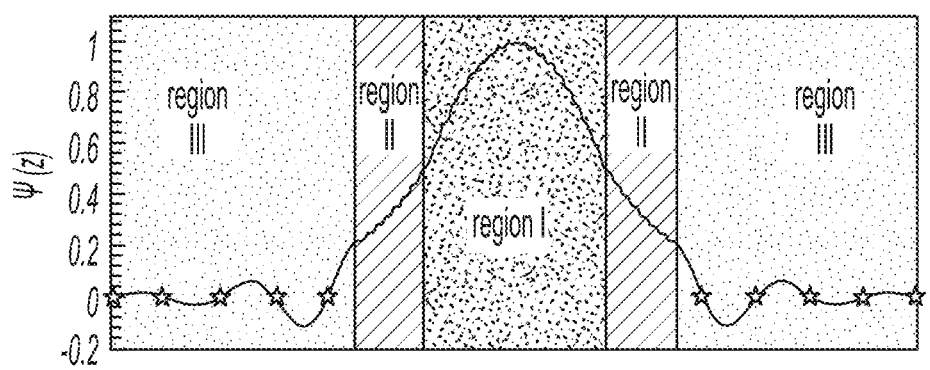
FIG. 7 illustrates an axial mode-shape function for the synthesized vibration mode with type-I & II dispersion characteristics, according to an embodiment of the present invention. Nodal points in region III are marked in stars.

FIG. 7 illustrates an axial mode-shape function for the synthesized vibration mode with type I & II dispersion characteristics, according to an embodiment of the present invention. The nodal points in region III are marked in stars.

The following sections analyze the vibration modes of a number of experimental waveguides.

I. Numerical Analysis of Vibration Modes

To verify the effective ness of dispersion engineering for energy localization of Lamb waves, analytically designed resonators with dispersion types I and II are simulated using COMSOL Multiphysics® finite element modeling (FEM) software. Table 1 summarizes the in-plane dimensions of the waveguide-based test-vehicles used for the comparison of the axial mode-shape functions, extracted from analytical derivations and COMSOL simulations. All the waveguides have a thickness of 20 µm in <100> silicon plate. Two sets of waveguides aligned to <110> and <100> crystal axis are used to compare the effect of crystallographic orientation on the vibration modes for 1st width-extensional (WE1) and 3rd width-extensional (WE3) Lamb waves, with dispersion types II and I, respectively. FIGS. 3 A-C demonstrates the geometry of the waveguides with in-plane dimensions presented in Table 1.

TABLE 1

Waveguide in-plane dimensions.

| | Region I | | Region II | | Region III | | |
|---|---|---|---|---|---|---|---|
| | $W_1$ | $Z_1$ | $W_2$ | $Z_2$ | $W_3$ | $Z_3$ | $f_0$ |
| Type I <110> | 114 μm | 300 μm | 120 μm | 100 μm | 108 μm | 100 μm | 108 MHz |
| Type II <110> | 50 μm | 150 μm | 52 μm | 100 μm | 45 μm | 100 μm | 82.9 MHz |
| Type III <100> | 50 μm | 150 μm | 56 μm | 100 μm | 40 μm | 100 μm | 76.5 MHz |

Besides the waveguides consisting of constituent rectangular regions with abrupt variation in widths in FIG. 3A, and an alternative geometry created from gradual variation of waveguide width is also studied in FIG. 3B. These two configurations are hereafter referred to as abrupt and gradual waveguides, respectively.

Figure 8B:
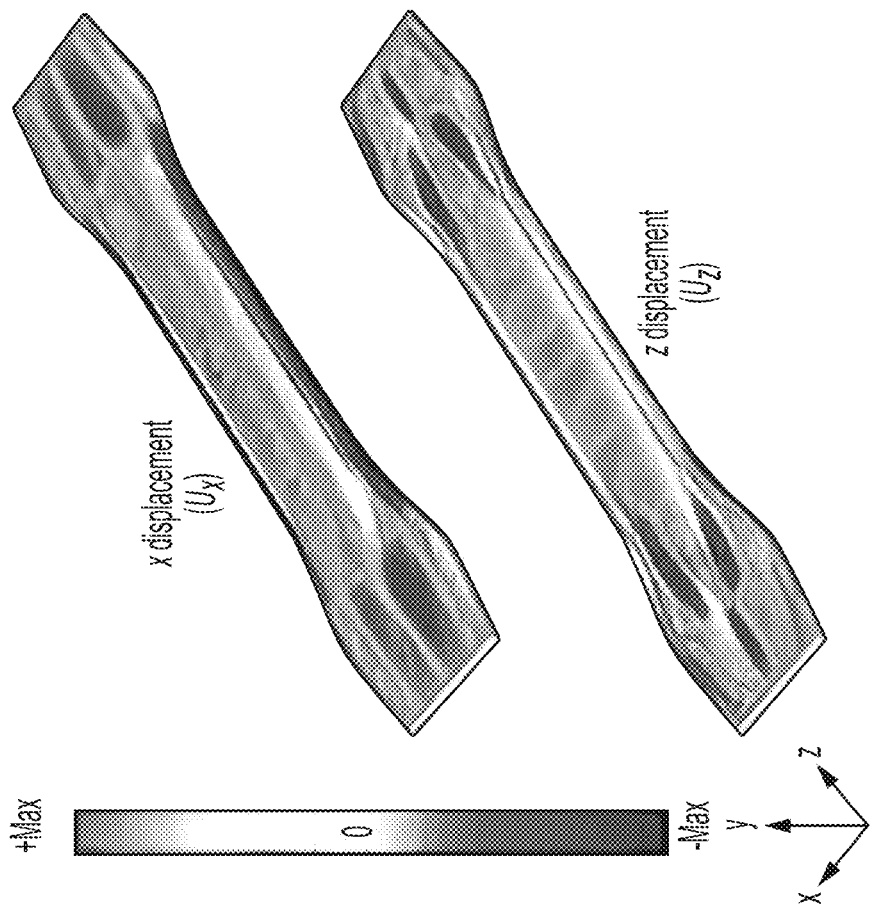
FIGS. 8A-B demonstrate a vibrational mode-shapes of the type-I waveguide, according to an embodiment of the present invention.
Figure 8A:
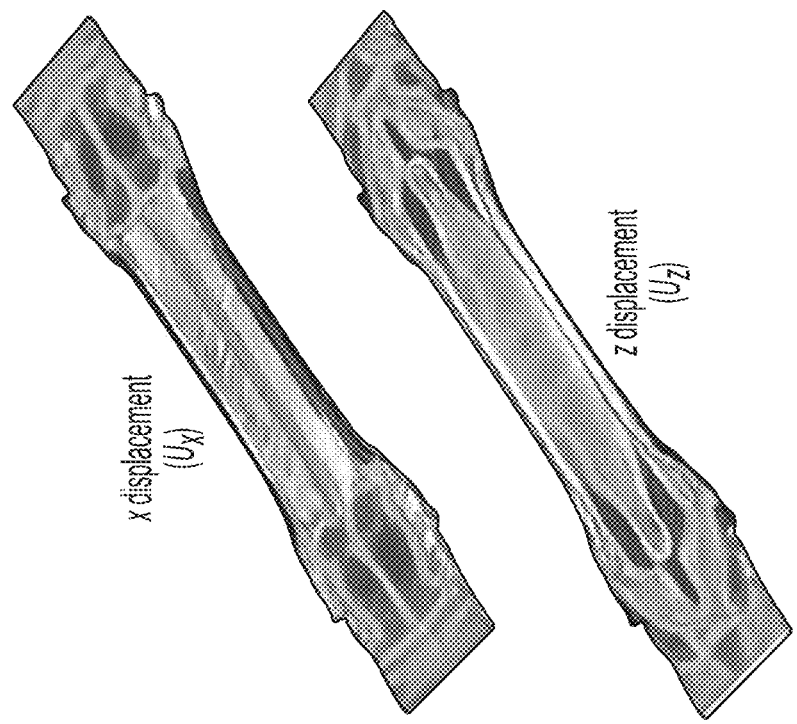

FIG. 8A shows the x displacement and z displacement for an abrupt vibrational mode-shape of the type-I waveguide operating in WE3 mode, and FIG. 8B shows the x displacement and z displacement for a gradual vibrational mode-shape of the type-I waveguide, operating in WE3 mode, respectively. It demonstrates the displacement fields in x and z direction (e.g., Ux and Uz), according to an embodiment of the present invention. These waveguides are hereafter referred to as "type I waveguides", while waveguides operating in WE1 Lamb wave demonstrating type II dispersion are referred as "type II waveguides," for simplicity. The displacement fields in x and z direction (e.g., Ux and Uz) are shown by the color code, highlighting the acoustic energy distribution over the length of the waveguide.

Figure 9A:
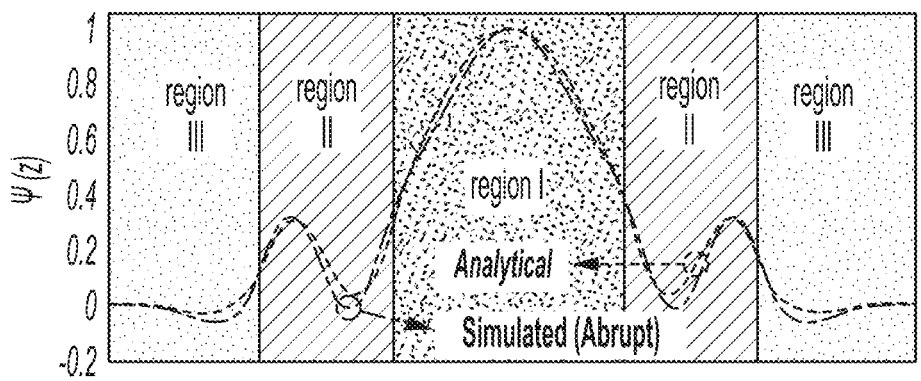
FIGS. 9A-B illustrates an analytical function and a FEM (finite element modeling) simulated axial mode-shape functions for waveguides with type-I dispersion, in abrupt and gradual in <110> crystallography and in <100> crystallography configurations, according to some embodiments of the present invention.
Figure 9B:
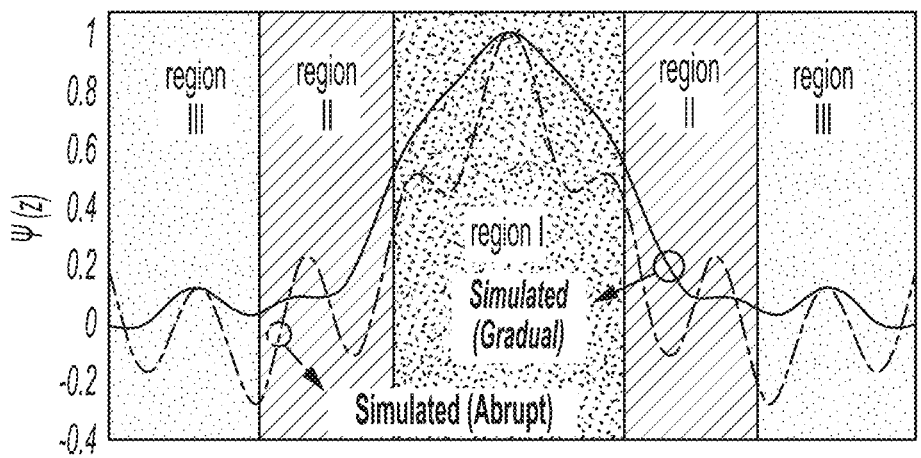

FIGS. 9A-9B compares an analytical and FEM simulated axial mode-shape functions for waveguides with type-I dispersion, in abrupt and gradual configurations, operating in WE3 cross-sectional vibration patterns, along with the analytical result, according to an embodiment of the present invention.

In all the simulations, waveguides are terminated with low-reflectivity boundary condition to avoid destructive reflection of P- and S-waves back into the waveguide. The simulated axial mode-shape function is identified through monitoring the particle displacement in an orthogonal direction to the waveguide axis, and over an arbitrary cut-line parallel to the axis.

As is evident in FIG. 9A, for an abrupt waveguide, the acoustic energy localization has been successfully achieved, the simulated data slightly deviates from analytical derivation. This can be attributed to the excitation of other Lamb waves at the same frequency that distorts the wave propagation dynamics beyond the model discussed.

In FIG. 9B, for a gradual waveguide, the simulated data deviates from analytical data significantly. Such distortion imposes energy distribution gradient in the region I of the waveguide, where transduction electrodes are to be placed. Thus, the kt² of the resonator is degraded. Alternatively, opting for the gradual configuration the flat-ness of the mode-shape function in region I can be recovered without distorting the energy trapping efficiency.

Figure 10:
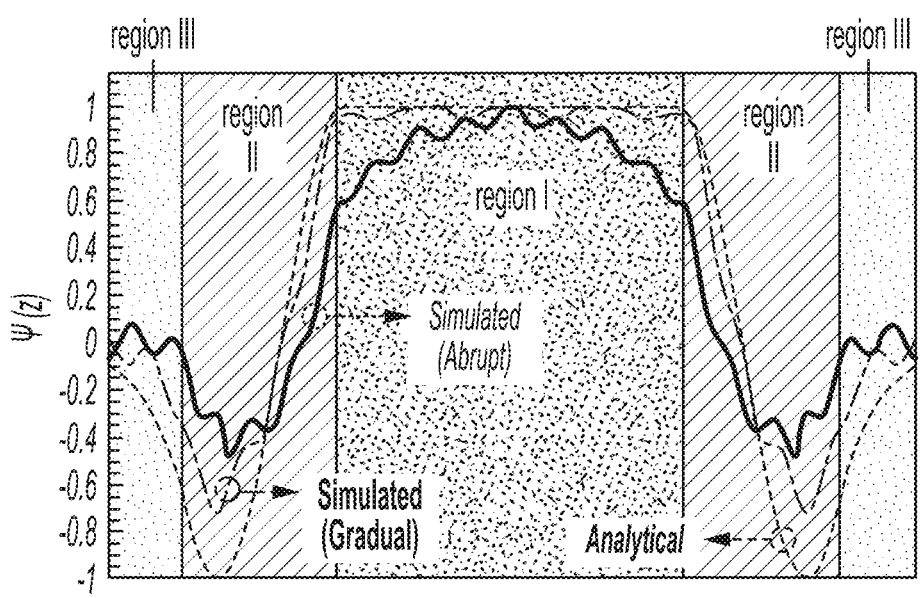
FIG. 10 illustrates an analytical, a FEM simulated axial mode-shape function for waveguides with type-II dispersion, in abrupt and gradual configurations and aligned to crystallographic direction of <100> plane, according to an embodiment of the present invention.
Figure 11A:
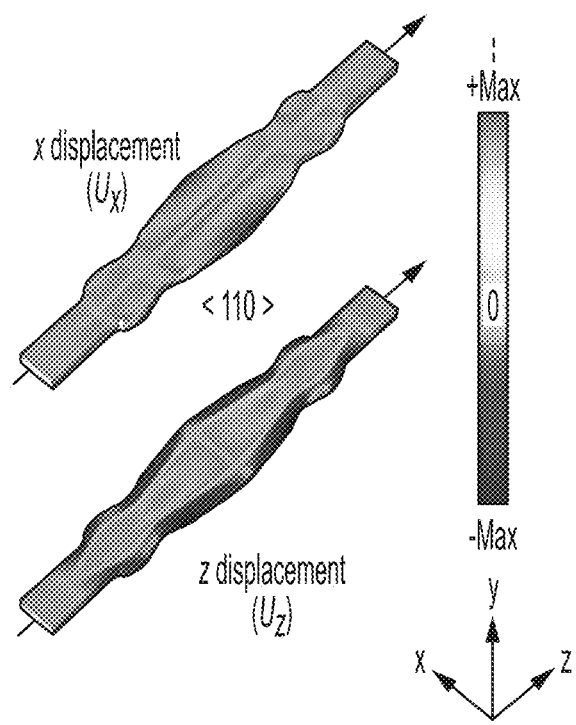
FIGS. 11A-D illustrate vibration mode shapes of type-II waveguides, operating in WE1 mode, according to some embodiments of the present invention.
Figure 11B:
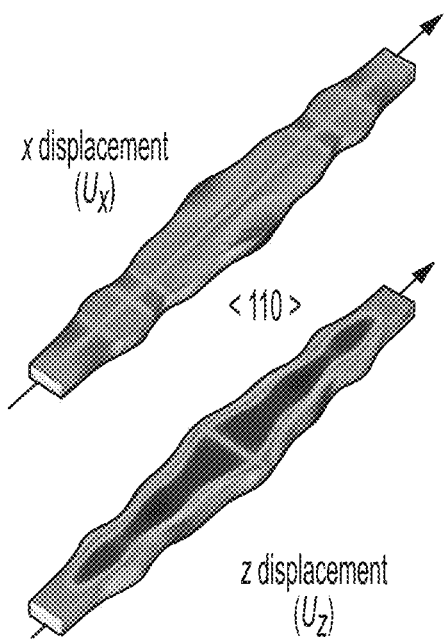
Figure 11C:
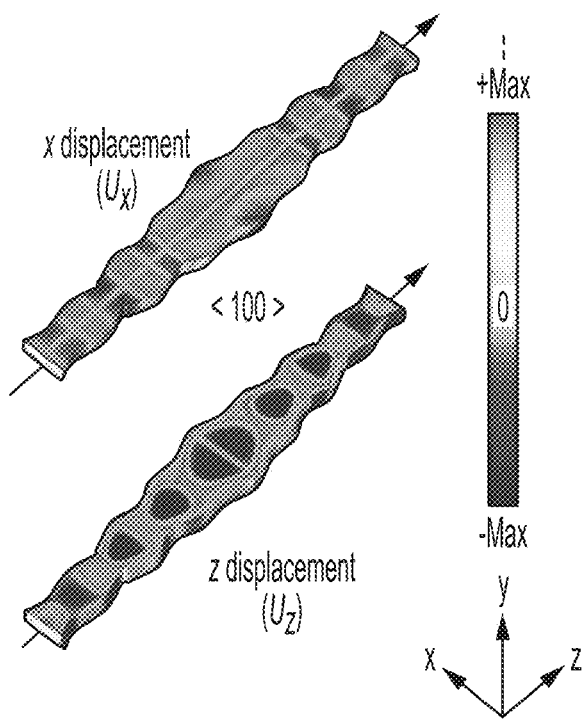
Figure 11D:
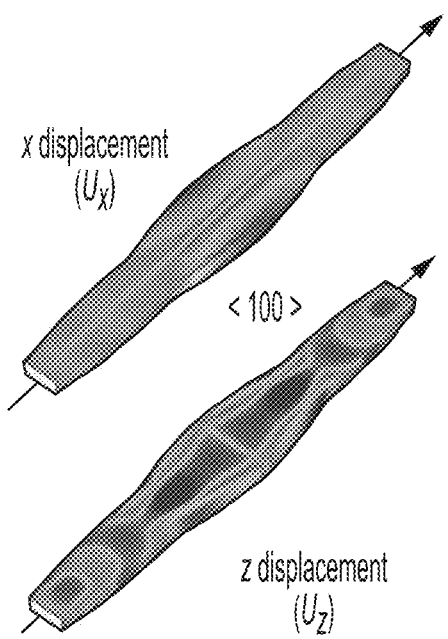

FIG. 11A shows in silicon plane <110> crystallographic direction, the x displacement and z displacement for an abrupt vibrational mode-shape of the type-II waveguide operating in WE1 mode. FIG. 11B shows in silicon plane <110> crystallographic direction, the x displacement and z displacement for a gradual vibrational mode-shape of the type-II waveguide, operating in WE1 mode, respectively. FIG. 11C shows in silicon plane <100> crystallographic direction, the x displacement and z displacement for an abrupt vibrational mode-shape of the type-II waveguide operating in WE1 mode. FIG. 11D shows in silicon plane <100> crystallographic direction, the x displacement and z displacement for a gradual vibrational mode-shape of the type-II waveguide, operating in WE1 mode, respectively. These figures compare the analytical and FEM simulated axial mode-shape functions for abrupt and gradual waveguides. While the analytical and simulated axial mode-shapes are very close in the case of the waveguide aligned to <110> direction, in <100>, the abrupt configuration fails to localize the acoustic energy in region I. This can be attributed to the destructive effect of other Lamb waves that are excited in the waveguide at $f_0$. Specifically, for the case of WE1 mode, $S_0$ waves can be excited with the large amplitude and thus get coupled to $S_1$ waves through poison's ratio; hence, diverging the actual mode shape from analytical design. Considering the significantly larger poison's ratio of silicon in <100> direction when compared to <110>, the destructive effect of $S_0$ waves are distinctively pronounced, as shown in FIG. 10.

Besides diverging from the analytical design, the excitation of $S_0$ waves may degrade the kt² and Q of the resonator, by distorting the uniform axial mode-shape in active region (region I) of the waveguide and serving as a means for acoustic energy dissipation into the substrate. Unfortunately, since the dispersion branch corresponding to $S_0$ Lamb wave passes through the origin of (ω, k) space, the energy location techniques based on evanescent waves are not applicable. In order to reduce the energy leakage through $S_0$ waves, the waveguide terminations can be geometrically engineered to realize acoustic bandgaps around operation frequency $f_0$, formation of reflecting mirrors, or opting for unparalleled termination surfaces to avoid the formation of S0-based standing waves with amplified amplitudes. Alternatively, as demonstrated in FIGS. 11A-D, opting for gradual architecture for <100>-aligned waveguides significantly suppress the undesired $S_0$ excitations and axial mode-shape distortion thus enabling efficient energy localization in region I. While the reason behind such significant improvement is not clearly understood, it can be attributed to the change in the dynamics of bulk acoustic wave propagation in waveguides with trapezoid architectures.

Figure 12A:
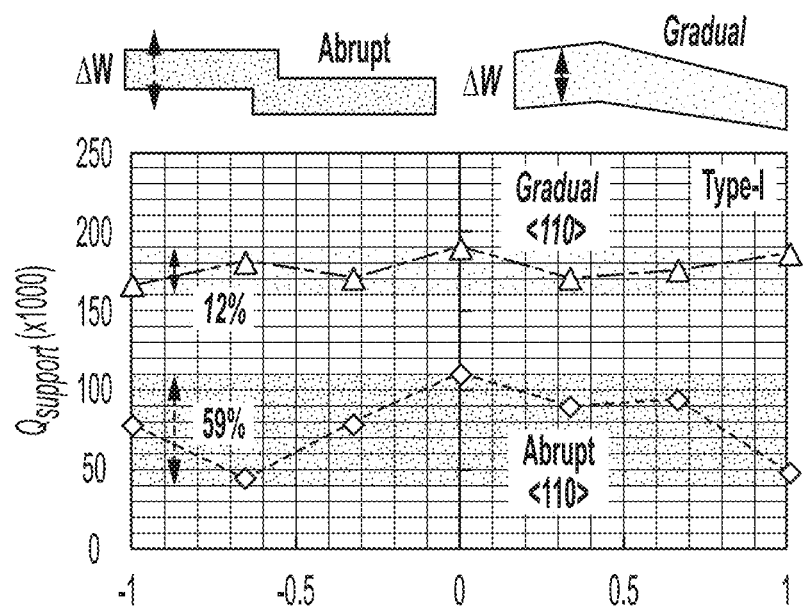
FIGS. 12A-B demonstrate COMSOL simulated variations in $Q_{support}$ induced by fabrication uncertainties of in-plane dimensions for type-I (FIG. 12A), and type-II in FIG. 12B waveguides, according to an embodiment of the present invention.
Figure 12B:
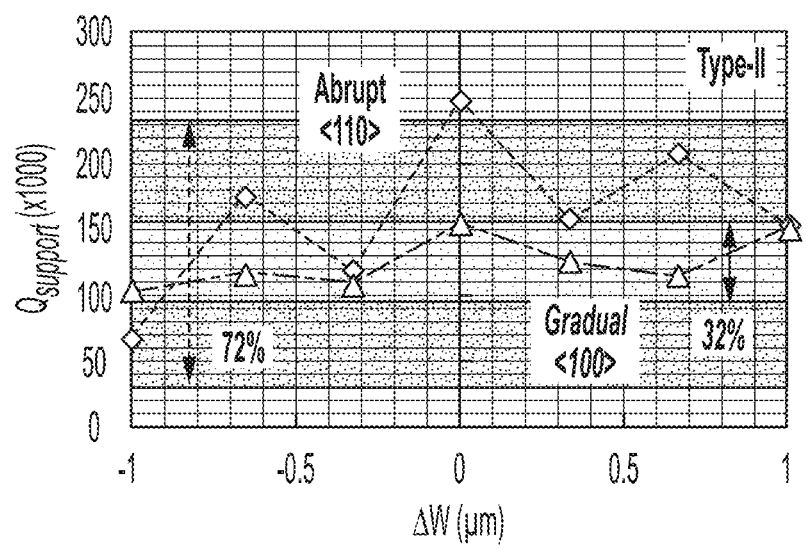
Figure 13A:
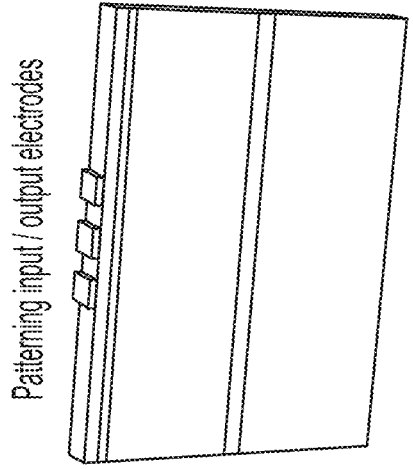
FIGS. 13A-F illustrate the cross-sectional structures at each step of the fabrication process for implementation of type I and II waveguides in an AlN-on-Si substrate, according to an embodiment of the present invention.
Figure 13B:
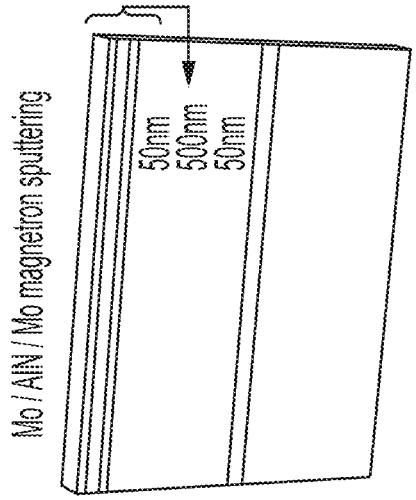
Figure 13C:
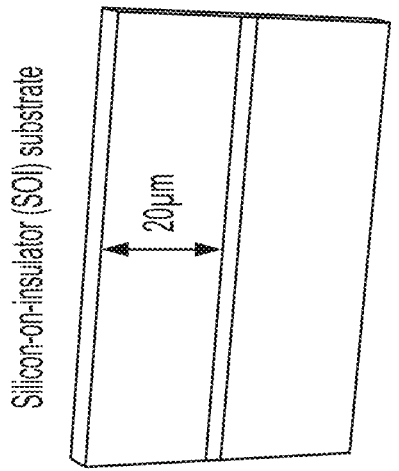
Figure 13D:
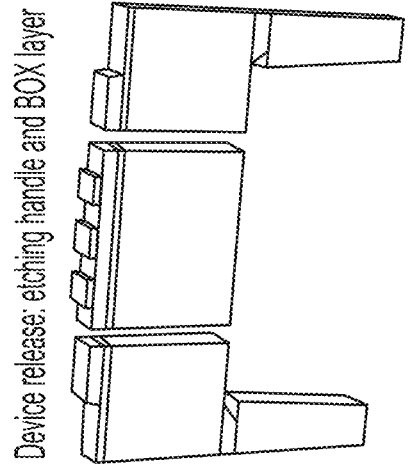
Figure 13E:
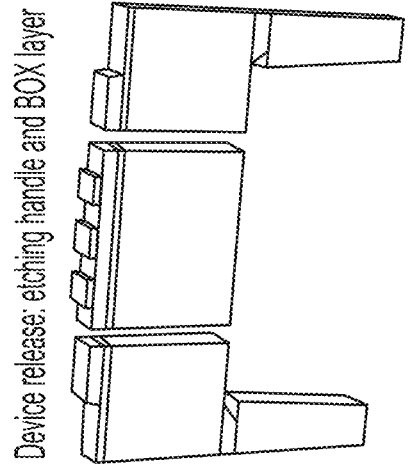
Figure 13F:
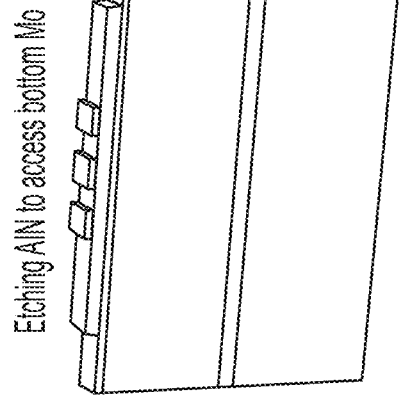

Finally, COMSOL simulations are used to verify the effect of fabrication uncertainties in the cross-sectional dimensions of the waveguide on acoustic energy localization. Considering the dependence of dispersion characteristics on the cross-sectional dimensions, the variations induced by lithographical or substrate thickness uncertainties may diverge the performance of the fabricated device from analytical design. To evaluate the effect of lithographical variations in fabrication process, energy localization efficiency is quantified using the support quality factor Perfectly matched layers (PML) are placed at the terminating surfaces of the waveguides in FIGS. 12A and 12B to extract $Q_{support}$, assuming zero reflection of the Lamb waves at the terminations. FIG. 12A and FIG. 12B compare the $Q_{support}$ variations in abrupt and gradual waveguides aligned to <110> and <100> crystallographic orientations for ±1 µm dimensional lithographical variations in trench widths. In type-I waveguides in FIG. 12A, the large improvement in $Q_{support}$ is evident when opting for gradual configuration. For the type-II waveguides in FIG. 12B, the lower $Q_{support}$ of <100>-aligned waveguide may be attributed to the higher Poisson's ratio in <100> direction that results in pronounced excitation of $S_0$ waves and consequently larger acoustic energy leakage. Finally, it is evident in FIG. 12A and FIG. 12B that the variations in $Q_{support}$ can be significantly reduced by opting for gradual waveguide configuration. Nevertheless, considering the large effect of the variations in waveguide in-plane dimensions on dispersion characteristics, analytically engineered waveguides are highly sensitive to lithographical uncertainties and require development of processing-bias compensation strategies.

II. Experimental Demonstration of Dispersion Engineered Lamb Wave Resonators

Two-port dispersion-engineered Lamb wave resonators are implemented in a silicon-on-insulator (SOI) substrate with 20 µm device layer thickness. The devices are transduced using a 500 nm piezoelectric AlN film deposited on the top surface of the substrate.

Fabrication Process

FIGS. 13A-F show the fabrication process steps for implementation of type I and II waveguides in AlN-on-Si substrate, according to an embodiment of the present invention. Step A shows preparing a silicon-on-insulator substrate, which has a silicon layer of approximate 20 µm thick. In Step B, a piezoelectric transduction stack is shown, the stack consists of a 500 nm AlN film, sandwiched between two 50 nm molybdenum (Mo) layers, and these films are deposited using magnetron sputtering. In Step C, the top Mo layer is patterned to create drive and sense transduction ports in the central region (e.g., region I) of the waveguides. This is followed by Step D, patterning the AlN film to accommodate access to bottom Mo layer, which serves as the common ground for the two-port transduction scheme. In Step E, the lateral geometry of the waveguides is then patterned through etching trenches in AlN, bottom Mo, and $S_1$ device layers. The reactive ion etching (RIE) process used for AlN patterning is optimized to ensure the straight sidewall of the film after etching. In Step F, the silicon layer is etched through a Bosch DRIE process optimized to reduce the size of scallops and ensure straight sidewall across the device thickness.

FIGS. 14A-D demonstrate the SEM images of several exemplary waveguide devices fabricated in an AlN-on-Si substrate, according to some embodiments of the present invention. FIG. 14A is a type-I abrupt waveguide on Si <110> surface. FIG. 14B shows a type-I gradual waveguide on Si <110> surface. FIG. 14C shows a type II abrupt waveguide on Si <110> surface, and FIG. 14D shows a type II gradual waveguide on Si <100> surface.

III. Device Characterization

The two-port resonators are characterized at room temperature using an instrument, for example, the Keysight N5242 PNA instrument.

Figure 15A:
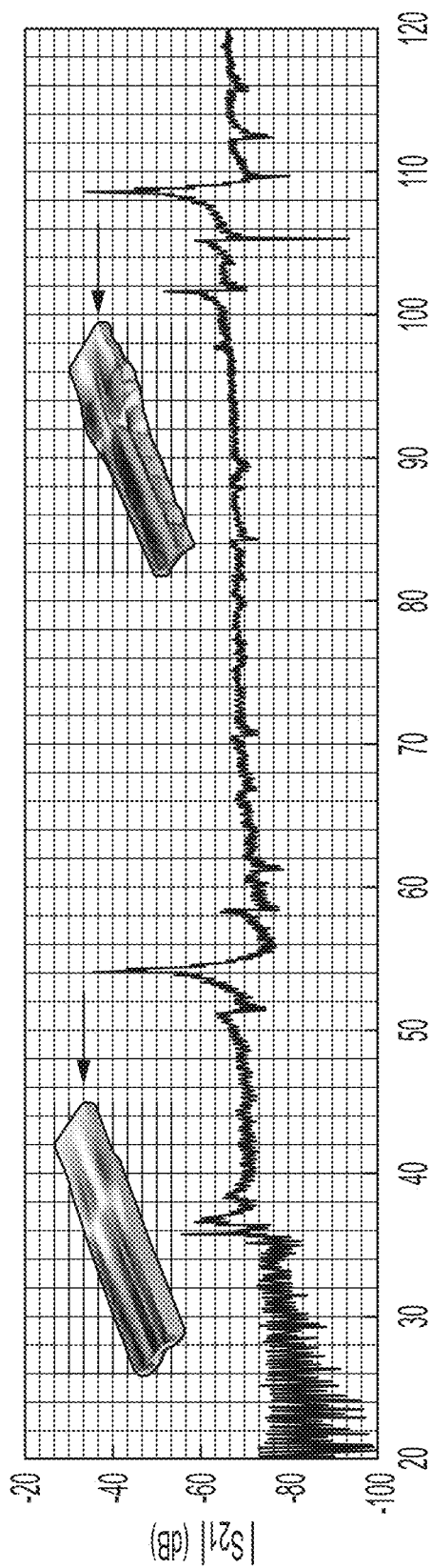
FIGS. 15A-D illustrate the measured frequency responses of type-I waveguides, according to some embodiments of the present invention.
Figure 15B:
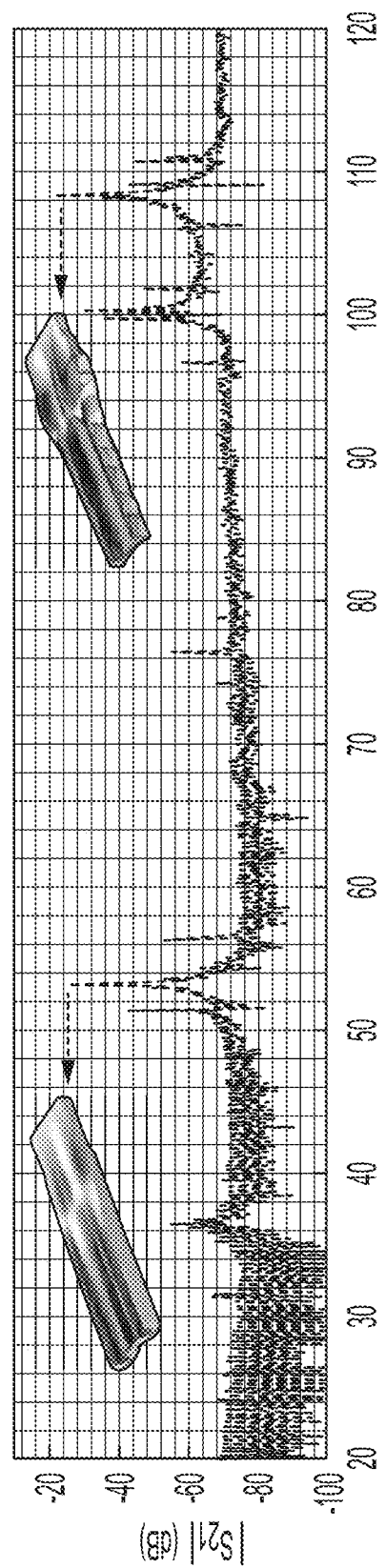
Figure 15C:
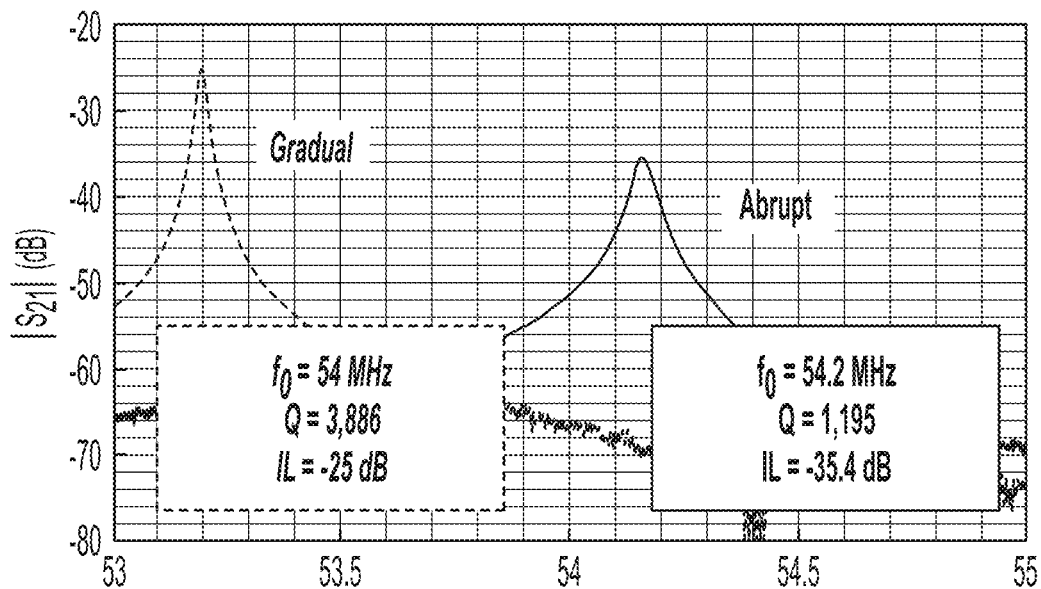
Figure 15D:
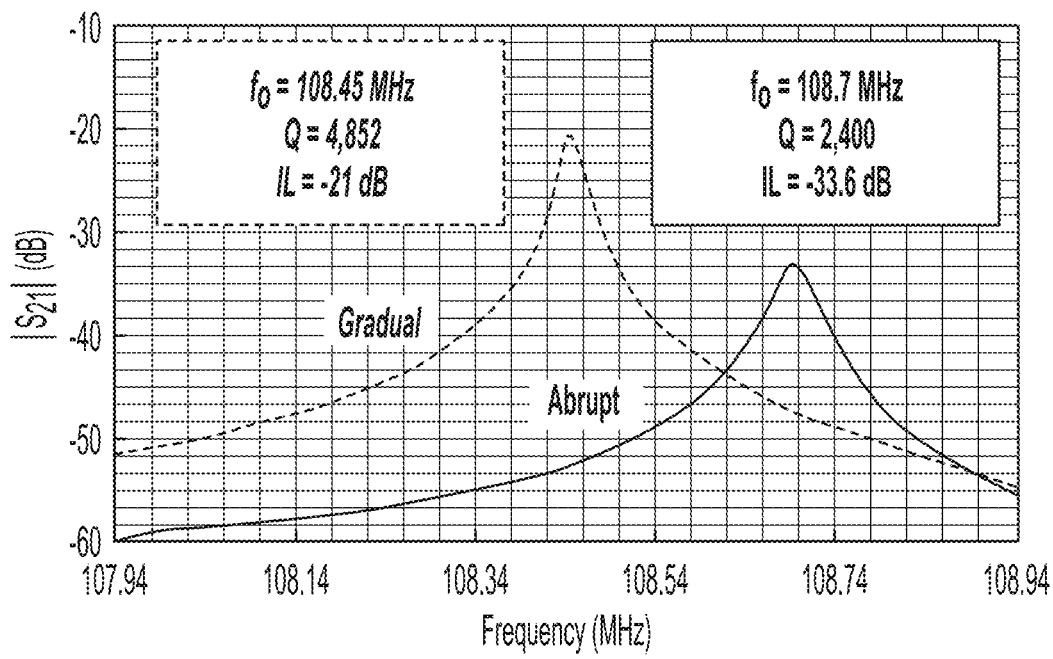

FIGS. 15A-D illustrate the measured frequency responses of type-I waveguides. FIG. 15A shows a large-span response of an abrupt waveguide. FIG. 15B shows a large-span response of the gradual waveguide. FIG. 15C shows a short-span response around flexural and FIG. 15D shows the WE3 mode for abrupt and gradual waveguides.

In FIG. 15A the frequency response of the type-I abrupt waveguide over 20-120 MHz span is demonstrated. The WE3 mode is evident at 108.7 MHz with a Q of 2,400. Besides this mode of interest, the frequency response shows another mode at 54.2 MHz with a Q of 1,195, which corresponds to the Lamb wave with out-of-plane flexural cross-sectional mode shape. FIG. 15B shows the frequency response of type-I gradual waveguide over 20-120 MHz span. Besides the two modes at ~54 MHz and ~108 MHz, the large span frequency response demonstrates excitation of several spurious modes, which can be attributed to the expansion of solution space in gradual waveguide compared to the abrupt counterpart. Despite the increased number of spurious modes, the gradual waveguide architecture demonstrates significant improvement in energy trapping efficiency through an increase in Q and decrease of insertion loss (IL).

FIG. 15C and FIG. 15D compare the short span frequency response of the abrupt and gradual waveguides around the flexural and WE3 modes at ~54 MHz and ~108 MHz, respectively. For the mode of interest (e.g., WE3), the Q is improved to 4,482 for gradual change, which is nearly two times larger compared to the abrupt counterpart. Furthermore, the insertion loss of the gradual waveguide is ~13 dB lower compared to the abrupt waveguide, which corresponds well with the improvement in the uniformity of simulated axial mode-shape function (FIG. 9) in electrode region (e.g., region I) of the waveguide.

Figure 16A:
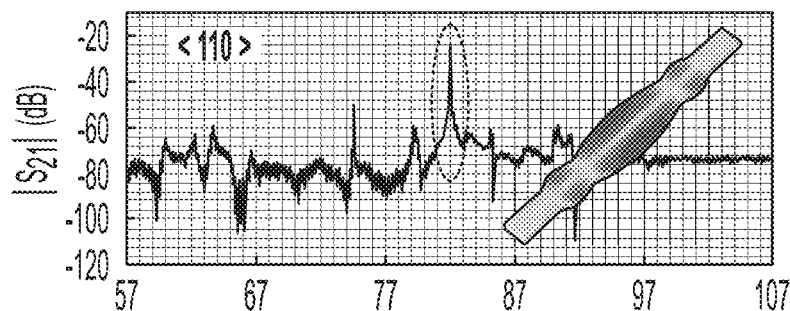
FIGS. 16A-D illustrate the measured frequency response of the type-II waveguides, according to an embodiment of the present invention.
Figure 16B:
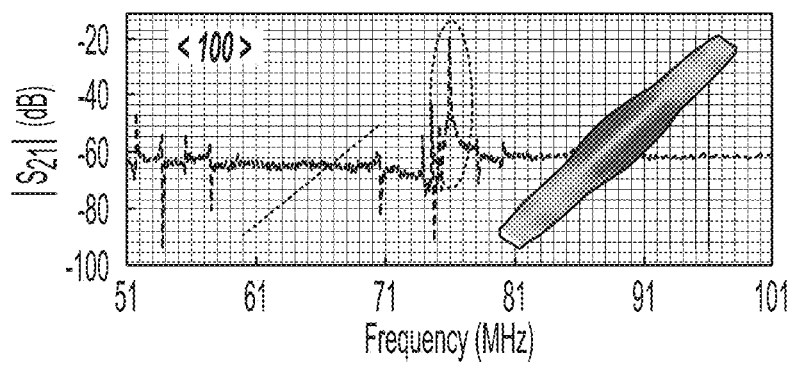
Figure 16C:
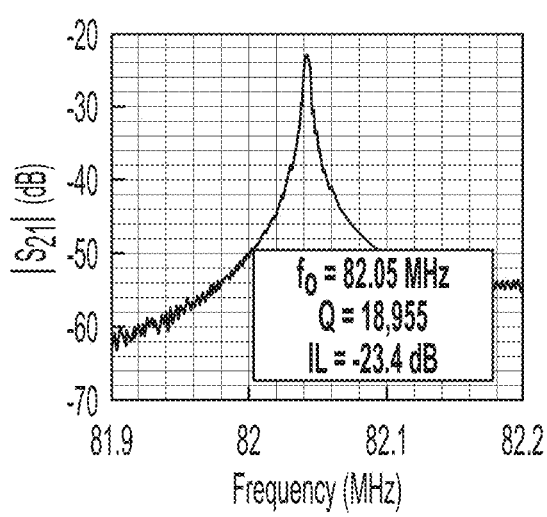
Figure 16D:
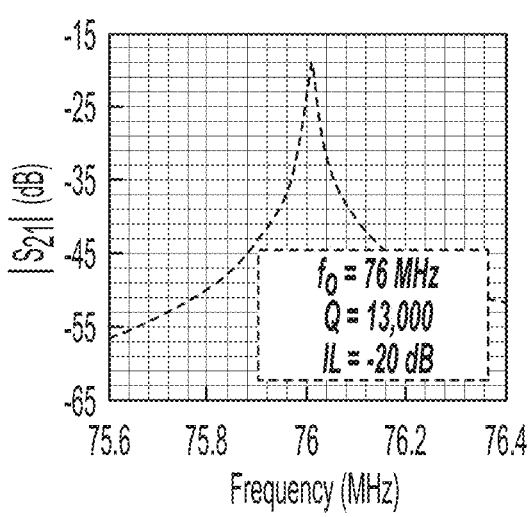

FIGS. 16A-D show the measured frequency response of the type-II waveguides, according to an embodiment of the present invention. FIG. 16A shows the large-span response of the abrupt waveguide aligned to <110> crystallographic direction. A high-Q of ~19,000 is measured at 82 MHz, with an insertion loss of −23.4 dB, showing the effectiveness of dispersion engineering for acoustic energy localization. FIG. 16B shows the large-span response of type-II for the gradual waveguide aligned to <100> crystallographic direction. A high-Q of 13,000 is measured at 76 MHz with an insertion loss of −20 dB. FIG. 16C shows the short-span frequency response of an abrupt waveguide aligned to <110> crystallographic direction; and FIG. 16D shows the short-span frequency response of a gradual waveguides aligned to <100> crystallographic direction, and here all are around WE1 mode.

IV. Experimental Verification of Analytical Mode Synthesis in Type-II Waveguide

To verify the effectiveness of the analytical mode synthesis experimental test-vehicles are implemented in AlN-on-Si platform to identify the contribution of regions II and III on the energy localization of WE1 Lamb waves with type-II dispersion.

Figure 17A:
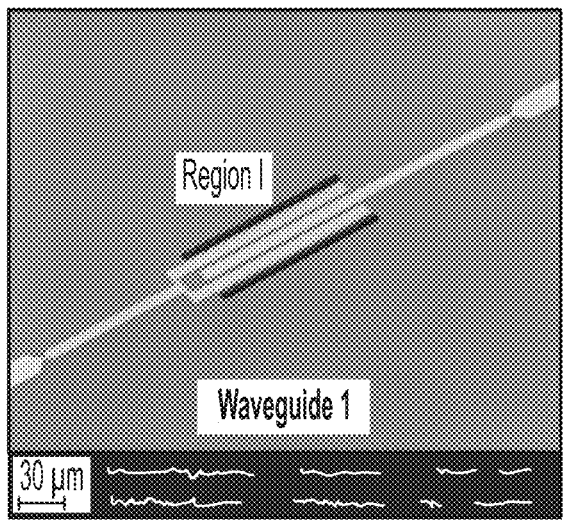
FIGS. 17A-D demonstrate SEM images of implemented test waveguides, according to an embodiment of the present invention.
Figure 17B:
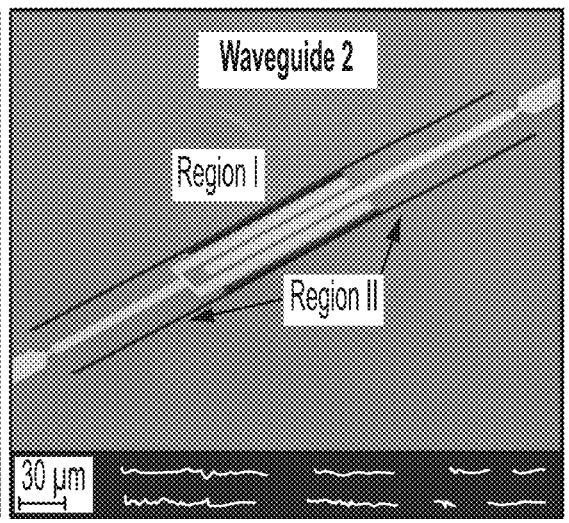
Figure 17C:
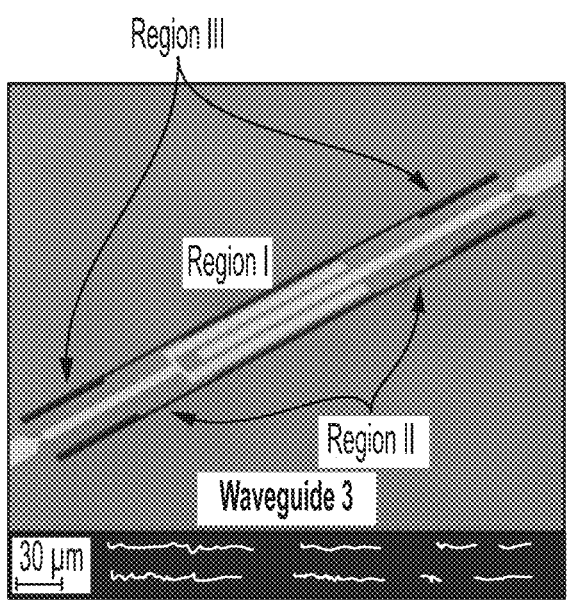
Figure 17D:
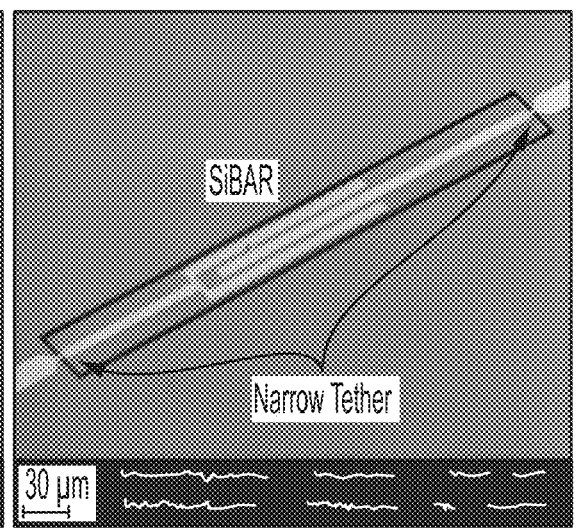

FIGS. 17A-C demonstrate the SEM images of three implemented test-vehicles implemented in AlN-on-Si substrate with 20 µm device layer thickness. These waveguides are implemented for verification of the effect of constituent regions in type-II abrupt waveguide. The waveguide 3 is analytically engineered to localize the acoustic energy in region I, through standing- and propagating-evanescent waves in regions II and III, respectively. Waveguides 1 and 2 are similar to waveguide 3, except missing one or both of regions II and III. The comparison of these test-vehicles enables identification of the significance of regions II and III for high-Q acoustic energy localization. These waveguides are compared with SiBAR anchored to the substrate through narrow tethers in FIG. 17D. All the devices are aligned to <110> crystallographic orientation.

The top Mo electrodes are identically patterned on all three waveguides (e.g., FIGS. 17A-C) and enable two-port characterization of frequency responses.

Figure 18:
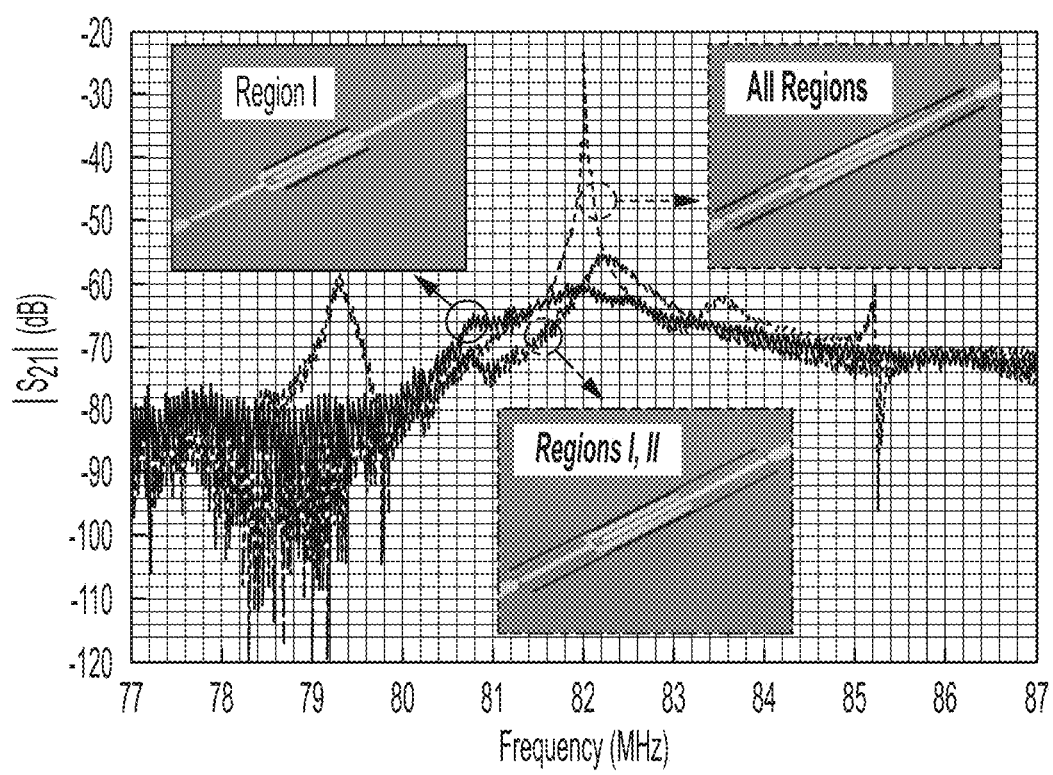
FIG. 18 shows measured frequency response of waveguides 1-3 in FIGS. 17A-C, according to an embodiment of the present invention.

FIG. 18 is a plot showing measured frequency responses of the waveguides in three regions I, II, and III which correspond to the three devices in FIGS. 17A-C, over a 10 MHz span around the WE1 resonance mode at 82 MHz frequency. While a high-Q of ~19,000 is measured for the waveguide with all three regions (e.g., waveguide 3 in FIG. 17C), waveguides 1 and 2 are not capable of efficient energy localization. Among these, for the waveguide 1 (e.g., FIG. 15A) COMSOL simulations anticipate the formation of a standing wave by geometrical suspension through anchoring the region I at the terminal faces. However, in practice, such fixed boundary condition is not realized due to acoustic coupling of Lamb waves into the substrate that depletes the energy out of the waveguide. The addition of region II, which supports standing-evanescent at $f_0$, slightly improves the energy localization in waveguide 2. However, small wavenumbers of the excited standing-evanescent wave and the finite length of the region II prevents sufficient attenuation of axial mode-function; hence, preventing from high-Q energy localization at the resonance mode. Finally, addition of the region III, which supports propagating-evanescent wave at excitation frequency (82 MHz), further attenuates the axial mode-shape amplitude and provides nodal points for perfect anchoring of the waveguide 1; thus, yielding a high-Q.

Besides enabling high-Q energy trapping, analytical mode engineering is highly effective in suppression of spurious modes.

Figure 19:
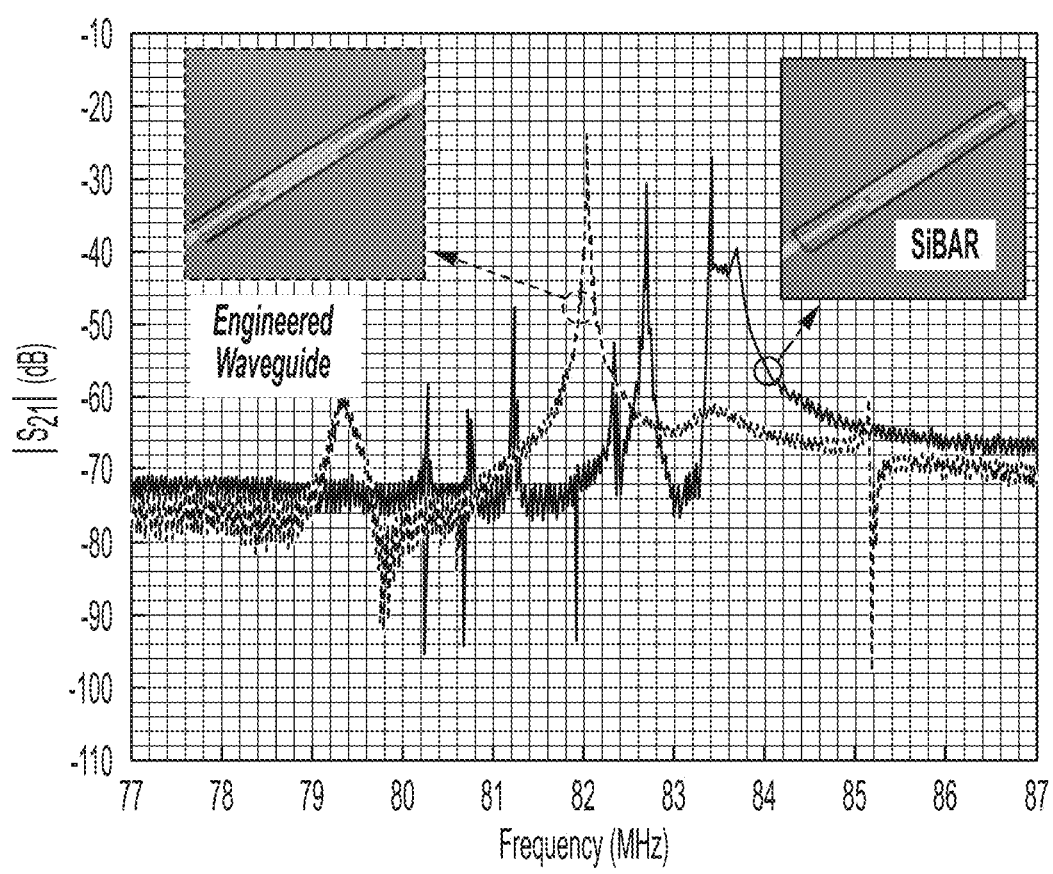
FIG. 19 shows the measured frequency response of the type-II dispersion engineered waveguide in comparison with a SiBAR that is anchored to the substrate by two narrow tethers in FIG. 17D, according to an embodiment of the present invention.

FIG. 19 shows the measured frequency response of the type-II dispersion engineered waveguide in comparison with a SiBAR that is anchored to the substrate by two narrow tethers, according to an embodiment of the present invention. It compares the frequency response of a rectangular silicon bulk acoustic resonator (SiBAR) anchored to the substrate through narrow tethers, with an analytically engineered waveguide. The width of the SiBAR is identical to the width of region I in the type-II dispersion engineered waveguide. The length of the two devices as well as electrode configurations are also identical. While the SiBAR suffers from various spurious modes in the 10 MHz frequency span around the WE1 mode at ~82 MHz, the engineered waveguide demonstrates a clean frequency response with a single high-Q resonance peak and significantly suppressed spurious modes. Such spurious suppression in a result of analytical engineering for a specific solution in abrupt waveguide architecture, which is not necessarily suitable for energy trapping of spurious modes. Therefore, while the anchoring of the engineered waveguide to the substrate using the wide tether (e.g., region III) does not affect the Q of synthesized mode, it provides a mean for energy leakage of the spurious modes out of the device. This is clearly not the case for the rectangular SiBAR that is surrounded by stress-free boundaries, which blindly trap all spurious modes in the device.

The above-mentioned embodiments are only used for exemplarily describing the principle and effects of embodiments of the present invention. One skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

The invention claimed is:

1. An acoustic waveguide, comprising:
   a first portion having a first width;
   two second portions, each having a second width different from the first width, formed at two opposing ends of the first portion, respectively; and
   two third portions, each having a third width different from the first width and the second width, formed coaxially at outer ends of the two second portions, respectively, wherein outer ends of the two third portions are in direct contact with a substrate.

2. The acoustic waveguide according to claim 1, wherein the first width is smaller than the second width, and the third width is smaller than the first width.

3. The acoustic waveguide according to claim 1, wherein the substrate is a single crystal substrate comprising a silicon substrate having crystallographic orientation <100>.

4. The acoustic waveguide according to claim 1, wherein the substrate is a single crystal substrate comprising a single crystalline silicon substrate having crystallographic orientation <110>.

5. The acoustic waveguide according to claim 1, wherein the substrate is on an insulator layer.

6. The acoustic waveguide according to claim 1, wherein a change of width is abrupt.

7. The acoustic waveguide according to claim 1, wherein a change of width is gradual.

8. The acoustic waveguide according to claim 1, wherein the substrate has a thickness in the range of 10 to 30 µm.

9. The acoustic waveguide according to claim 1, wherein the substrate has a thickness in the range of 15-25 µm.

10. The acoustic waveguide according to claim 1, further comprising an aluminum nitride film on the substrate.

11. The acoustic waveguide according to claim 10, wherein the aluminum nitride film on the substrate is about 500 nm thick.

* * * * *